United States Patent [19]
Hasegawa

[11] Patent Number: 5,874,912
[45] Date of Patent: Feb. 23, 1999

[54] SERIAL-PARALLEL A/D CONVERTER

[75] Inventor: Hiroshi Hasegawa, Tokyo, Japan

[73] Assignee: NEC Corporation, Tokyo, Japan

[21] Appl. No.: 938,882

[22] Filed: Sep. 26, 1997

[30] Foreign Application Priority Data

Sep. 30, 1996 [JP] Japan ................................. 8-278933

[51] Int. Cl.⁶ .................................................. H03M 1/12
[52] U.S. Cl. ........................................ 341/161; 341/155
[58] Field of Search .................................... 341/161, 155, 341/156, 159, 100, 158

[56] References Cited

U.S. PATENT DOCUMENTS 5,151,700  9/1992  Matsuzawa et al. ..................... 341/156
5,187,483  2/1993  Yonemaru ............................... 341/156

FOREIGN PATENT DOCUMENTS

A-6-232747  8/1994  Japan .

*Primary Examiner*—Brian Young
*Attorney, Agent, or Firm*—Scully, Scott Murphy & Presser

[57] ABSTRACT

A sub-A/D converter of a first stage is constituted by a serial-parallel A/D converter, which does not use a subtractor, comprising two sub-A/D converters and a first D/A converter. A subtracting amplifier includes a subtractor selecting an analog input signal or the output of the first D/A converter and subtracting the output of a second D/A converter from the selected signal, and an amplifier amplifying the output of the subtractor. The subtracting amplifier is provided for each of a plurality of comparators, which are capable of receiving inputs in timeshared fashion, constituting a sub-A/D converter of a second stage.

23 Claims, 19 Drawing Sheets

SERIAL-PARALLEL A/D CONVERTER

BACKGROUND OF THE INVENTION

1. Field of the Invention

This invention relates to an analog/digital converter (referred to as an "A/D converter") for converting an analog signal to a digital signal and, more particularly, to a serial-parallel A/D converter.

2. Description of the Related Art

A serial-parallel A/D converter is advantageous in that the number of comparators involved can be made less than in a full-parallel A/D converter in which a required number of comparators are connected in parallel. A prior-art example of a serial-parallel A/D converter is illustrated in the block diagram of FIG. 16.

A first (first-stage) sub-A/D converter AD1 and a second (second-stage) sub-A/D converter AD2 in FIG. 16 are both constituted by full-parallel A/D converters. An analog input signal Vin is coarsely A/D-converted (to obtain higher order digital data) by the first sub-A/D converter AD1, after which the resulting digital data is D/A-converted by a D/A converter DAC1 to generate an approximate analog reproduction signal. The difference between the analog input signal Vin and the approximate analog reproduction signal is obtained by a subtractor SUB, the difference is amplified by an amplifier AMP, and the amplified signal is finely A/D-converted by the second sub-A/D converter AD2 (to obtain lower-order digital data).

In actual applications, the device is so adapted as to perform a pipeline operation by inserting sample-and-hold circuits at the various components in order to sample and hold the signals. For the sake of simplicity, however, a description thereof is not given here.

Digital logic 1490 subjects the digital data from the first and second sub-A/D converters AD1and AD2 to necessary processing such as delay, synchronization, digital addition and digital compensation, etc., to thereby obtain the final digital output signal.

As shown in FIG. 16, comparison reference voltages Vref1, Vref2 which enter the respective sub-A/D converters are required in a number equivalent to the number of comparators that construct the sub-A/D converters.

FIG. 17 is a block diagram illustrating the construction of a second prior-art example of a serial-parallel A/D converter. As shown in FIG. 17, the second example of the prior art differs from the first example of the prior art depicted in FIG. 16 in that after the analog input signal Vin is coarsely A/D-converted by the sub-A/D converter AD1 of the first stage, a comparison reference voltage in the vicinity of the analog input signal is produced by the D/A converter DAC1 so that the sub-A/D converter AD2 of the second stage compares this comparison reference voltage with the analog input signal Vin to finely A/D convert the input signal.

More specifically, the second-stage sub-A/D converter AD2 in the first example of the prior art shown in FIG. 16 uses the subtractor SUB to obtain the difference between the analog input signal Vin and the approximate analog reproduction signal, amplifies this difference and compares the amplified signal with the comparison reference voltage. By contrast, in the second example of the prior art shown in FIG. 17, the analog input signal Vin is not amplified and is compared with a finer comparison reference voltage. In the second example of the prior art, subtraction is actually performed between the analog input signal and the comparison reference voltage internally of the comparator. Further, in the second example of the prior art, the comparison reference voltage Vref1 for the first-stage sub-A/D converter AD1 often is supplied by the output of the D/A converter DAC1. (In FIG. 17, the comparison reference voltage Vref1 from the D/A converter DAC1 to the A/D converter AD1 is indicated by the dashed line.)

Hereinafter the construction of the first example of the prior art shall be referred to as a "serial-parallel A/D converter which uses an explicit subtractor", and the construction of the second example of the prior art shall be referred to as a "serial-parallel A/D converter which does not use an explicit subtractor".

FIG. 18 is a block diagram illustrating the construction of a multiple-stage serial-parallel A/D converter according to a third example of the prior art. As shown in FIG. 18, the third example of the prior art is obtained by increasing the number of stages of the serial-parallel A/D converter of the first example of the prior art to three. The number of comparators constructing each sub-A/D converter (of full-parallel type) can be made fewer than in the first example of the prior art.

More specifically, in case of e.g. a 9-bit A/D converter, the sub-A/D converters AD1, AD2 would be constituted by two stages of four bits and five bits in the first example of the prior art shown in FIG. 16, so that the total number of comparators constructing the sub-A/D converters would be $2^4+2^5=16+32=48$.

On the other hand, in the third example of the prior art shown in FIG. 18, the sub-A/D converters AD1 to AD3 would be constituted by three stages of three bits each and the total number of comparators constructing the sub-A/D converters would be $2^3+2^3+2^3=8+8+8=24$.

A fourth example of the prior art is shown in FIG. 19, which illustrates the construction of a serial-parallel sub-ranging A/D converter proposed in the specification of Japanese Patent Application Laid-Open (KOKAI) No.Hei-6-232747. As shown in FIG. 19, this A/D converter is such that the first-stage sub-A/D converter of the serial-parallel A/D converter described as the first example of the prior art is constituted by a similar serial-parallel A/D converter, and the second-stage sub-A/D converter is further constituted by a similar serial-parallel A/D converter.

In FIG. 19, amplifying means that would be inserted between a subtractor 1703 and a sub-A/D converter 1704, between a subtractor 1707 and a sub-A/D converter 1708, and between a subtractor 1711 and a sub-A/D converter 1712 are omitted. In other words, amplifying means generally are inserted in order to improve precision but are not inserted here.

SUMMARY OF THE DISCLOSURE

The recent trend toward lower power supply voltages for digital LSI and more detailed LSI processes has been accompanied by demand for A/D converters which operate at low power supply voltage. However, when power supply voltage decreases, various problems arise. For example, the usable signal amplitude becomes too small and conventional high-performance amplifiers cannot be employed. As a result, it is difficult to realize a highly precise A/D converter.

According to the analysis underlying the present invention, the serial-parallel A/D converters described above as examples of the prior art have the following problems:

(1) First, in the serial-parallel A/D converter (FIG. 16) described as the first example of the prior art, the voltage range of the comparison reference voltage Vref2 of the second-stage sub-A/D converter and the output voltage range of the amplifier AMP must agree. The amplifier AMP is required to have an accurate amplification factor.

Further, when the resolution (number of bits) of the A/D converters is raised, the number of bits of the sub-A/D converters of the full-parallel arrangement also increase. As a result, the number of comparators constructing the sub-A/D converters increases, the scale of the circuitry increases and so does power consumption.

(2) Next, in the serial-parallel A/D converter (FIG. 17) described as the second example of the prior art, the problem of the first example of the prior art, namely the fact that the amplifier AMP requires an accurate amplification factor, does not arise. However, since signal amplification does not take place, the comparators constructing the second-stage sub-A/D converter require good resolution. As a result, obtaining higher precision is difficult.

(3) In the serial-parallel A/D converter (FIG. 18) described as the third example of the prior art, the number of bits of the sub-A/D converters can be reduced even if the resolution (number of bits) of the A/D converter is raised. This makes it possible to reduce the number of comparators. However, since the number of bits processed at each stage is small, the voltage difference between the analog input voltage and the output voltage of the D/A converter takes on a large value and error increases owing to the influence of the input-voltage dependence of charge injection in the analog switch used in the subtractor 1602 in FIG. 18.

The charge injection mentioned here refers to the generation of electric charge other than that of a signal in a signal path when an analog switch, particularly a switch using a MOSFET (field-effect transistor), is off. If the amount of the electric charge is constant at all times, it can be canceled out at the time of subtraction. However, the size of the charge differs depending upon the voltage impressed across the switch. Therefore, if the voltage difference is large when the two voltages are subtracted using the switch, an error commensurate with the difference in amount of charge injection is produced.

Accordingly, the error becomes large when the difference between the two voltages involved in subtraction is large. Hence, the third example of the prior art is disadvantageous in that the error produced by the subtractor is large.

(4) In the serial-parallel A/D converter (FIG. 19) described as the fourth example of the prior art, the number of bits of the sub-A/D converters can be reduced. However, in a case where amplification is not performed by amplifying means, the comparators are required to have good resolution and it is difficult to achieve higher precision.

If amplification is carried out by amplifying means, the voltage range of the comparison reference voltage of the second-stage sub-A/D converter and the output voltage range of the amplifying means within the serial-parallel A/D converter must agree and the amplifying means is required to have an accurate amplification factor. Thus, various problems remain unsolved.

Accordingly, an object of the present invention is to provide a highly precise serial-parallel A/D converter in which a highly accurate amplifier is not required, error produced by a subtractor is reduced and operation is possible at a low power supply voltage.

Further objects will become apparent in the entire disclosure.

According to a first aspect of the present invention, the foregoing object is attained by providing a novel serial-parallel A/D converter. The serial-parallel A/D converter comprises: a first sub-A/D converter module A/D-converting a first analog input signal, a first D/A converter D/A-converting an output of the first sub-A/D converter module, a first subtractor subtracting an output of the first D/A converter from the first analog input signal, a first amplifier amplifying an output of the first subtractor, and a second sub-A/D converter A/D-converting an output of the first amplifier. The first sub-A/D converter module includes a third sub-A/D converter A/D-converting the first analog input signal, a second D/A converter D/A-converting an output of the third sub-A/D converter, and a fourth sub-A/D converter comparing the first analog input signal and an output of the second D/A converter and operating A/D-conversion.

According to a second aspect of the present invention, the serial-parallel A/D converter has one or a plurality of the fourth sub-A/D converters comparing the first analog input signal and an output from the second D/A converter and operating A/D-conversion, wherein the second D/A converter D/A-converts the output of the third sub-A/D converter and, in a case where the second sub-A/D converter has a plurality of the fourth sub-A/D converters, D/A-converts outputs from all fourth sub-A/D converters other than that of the final stage.

According to a third aspect of the present invention, the first D/A converter and the second D/A converter mentioned in the first or second aspect are replaced by (i.e., formed of) a single third D/A converter.

In a fourth aspect of the present invention, the foregoing object is attained by providing a serial-parallel A/D converter comprising a first sub-A/D converter module A/D-converting a first analog input signal, a third D/A converter D/A-converting an output of the first sub-A/D converter module, a first subtractor subtracting an output of the third D/A converter from the first analog input signal, a first amplifier amplifying an output of the first subtractor, and a second sub-A/D converter A/D-converting an output of the first amplifier. The serial-parallel A/D converter is further characterized in that the second sub-A/D converter is constituted by comparators capable of receiving and comparing input signals and comparison reference signals by time sharing; wherein instead of the first subtractor, there are provided a second subtractor selecting the first analog input signal or the output of the third D/A converter and subtracting the output of the third D/A converter from the selected signal, and second amplifier amplifying an output of the second subtractor, and a plurality of the second subtractors and a plurality of the second amplifiers are provided so as to correspond to respective ones of the comparators constituting the second sub-A/D converter.

According to a firth aspect of the present invention, the serial-parallel A/D converter of the fourth aspect preferably further comprises a fourth D/A converter D/A-converting the output of the first sub-A/D converter, wherein the second subtractor selects the first analog input signal or the output of the third D/A converter and subtracts an output of the fourth D/A converter from the selected signal.

According to a sixth aspect of the present invention, the serial-parallel A/D converter of the first to fourth aspects further comprises a fourth D/A converter D/A-converting the output of the first sub-A/D converter and, instead of the first subtractor, a second subtractor selecting the first analog input signal or the output of the third D/A converter and subtracting the output of the fourth D/A converter from the selected signal, and second amplifier amplifying an output of the second subtractor, wherein a plurality of the second subtractors and second amplifier are provided so as to correspond to respective comparators constituting the second sub-A/D converter.

According to a seventh aspect of the present invention, the serial-parallel A/D converter of the fourth, fifth or sixth aspect has the second sub-A/D converter, the plurality of second subtractors and the plurality of second amplifiers form a unit and there are provided two or more units.

According to an eighth aspect of the present invention, the foregoing object is attained by providing a multiple-stage serial-parallel A/D converter of two or more stages in which two initial stages which start the A/D conversion are replaced by the serial-parallel A/D converter according to the invention set forth in any of the aspects 1 to 7.

The actions of each aspect of the invention constructed as set forth above will now be described.

As for the action of the present invention described in the aspect 1 or 2, the two-stage serial-parallel A/D converter which uses an explicit subtractor is such that the sub-A/D converter of the first stage is constituted by a serial-parallel A/D converter which does not use the explicit subtractor. As a result, the number of comparators and an error produced by the subtractor can be reduced.

As for the action of the present invention described in aspect 3, the serial-parallel A/D converter according to the invention of aspect 1 or 2 is such that a single D/A converter performs the function of two D/A converting means. This makes it possible to reduce the scale of circuitry as well as power consumption correspondingly.

The action of the present invention described in aspect 4 is as follows. As contrasted to the serial-parallel A/D converter according to the first example of the prior art, there is provided with a plurality of subtractors and a plurality of amplifying means to correspond to respective comparators constituting the second sub-A/D converter, and signals obtained by subtracting the output of the D/A converter from the analog input signal and comparison reference signal are supplied to the comparator of the second sub-A/D converter via the subtractor and amplifying means by time sharing. As a result, less precision is required for the amplifier.

As for the action of the present invention described in aspect 5, as compared to the serial-parallel A/D converter of aspect 3, there is provided with a fourth D/A converter of special-purpose, which generates a signal to be subtracted, besides the third D/A converter, thereby making it possible to perform the subtraction accurately and at high speed.

The action of the present invention described in aspect 6 is as follows. The serial-parallel A/D converter described in any of aspects 1, 2 and 3 and the serial-parallel A/D converter described in aspect 4 or 5 are combined, whereby there is obtained a highly precise A/D converter in which error produced by subtractors is reduced, the precision demanded of amplifiers is relaxed and operation is possible at low power supply voltage while an increase in the number of comparators is suppressed. In addition, by providing the fourth D/A converter in addition to the first D/A converter, second D/A converter and third D/A converter, subtraction can be carried out accurately and at high speed.

The action of the present invention described in aspect 7 is as follows. The second sub-A/D converter, the plurality of second subtractors and the plurality of second amplifiers are provided, making up a unit, and two or more of units are provided. By causing these to operate in alternating fashion, it is possible to raise the conversion speed of the serial-parallel A/D converter.

As for the action of the present invention described in aspect 8, the two initial stages which start the A/D conversion in the multiple-stage serial-parallel A/D converter of two or more stages are replaced by the serial-parallel A/D converter of any of the aspects 1 to 6 and 7, thereby making it possible to realize a highly precise A/D converter having the optimum construction.

Thus, in accordance with the serial-parallel A/D converter of the present invention, as described above, a sub-A/D converter which is the first stage of a serial-parallel A/D converter using an explicit subtractor according to the prior art is replaced (and now constituted) by a serial-parallel A/D converter which does not use an explicit subtractor. This has the advantage of making it possible to reduce the error produced by the subtractor while at the same time suppressing an increase in the number of comparators.

In addition, the serial-parallel A/D converter of the present invention has a subtractor and an amplifier (or amplifying subtractor) corresponding to each comparator of the sub-A/D converter of the second stage. This makes it possible to dispense with a high-precision amplifier and to provide a serial-parallel A/D converter that is suited to operation at low power supply voltage.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

Embodiments of a serial-parallel A/D converter according to the present invention will now be described in detail with reference to the drawings.

Embodiments of the present invention described below are constituted by first and second aspects of the invention and a combination thereof. The first aspect of the invention is for raising accuracy while suppressing an increase in the number of comparators to an extent the same as that of the multiple-stage serial-parallel A/D converter according to the prior art. The second aspect of the invention is for reducing the precision of the amplifier required in the high-precision serial-parallel A/D converter which uses the explicit subtractor according to the prior art, and for performing a highly precise A/D conversion even at a low power supply voltage.

[First Embodiment]

Figure 1:
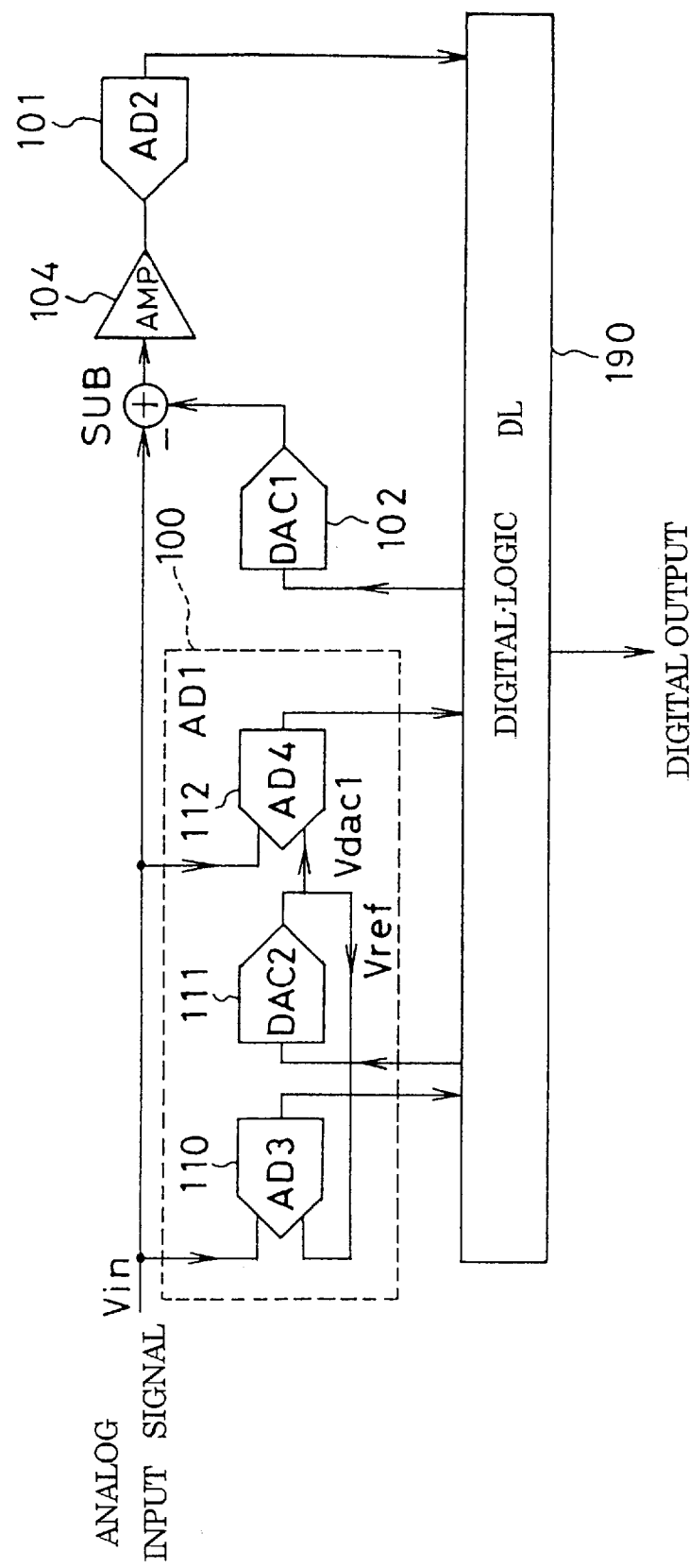
FIG. 1 is a diagram illustrating the construction of a first embodiment of the present invention.
Figure 16:
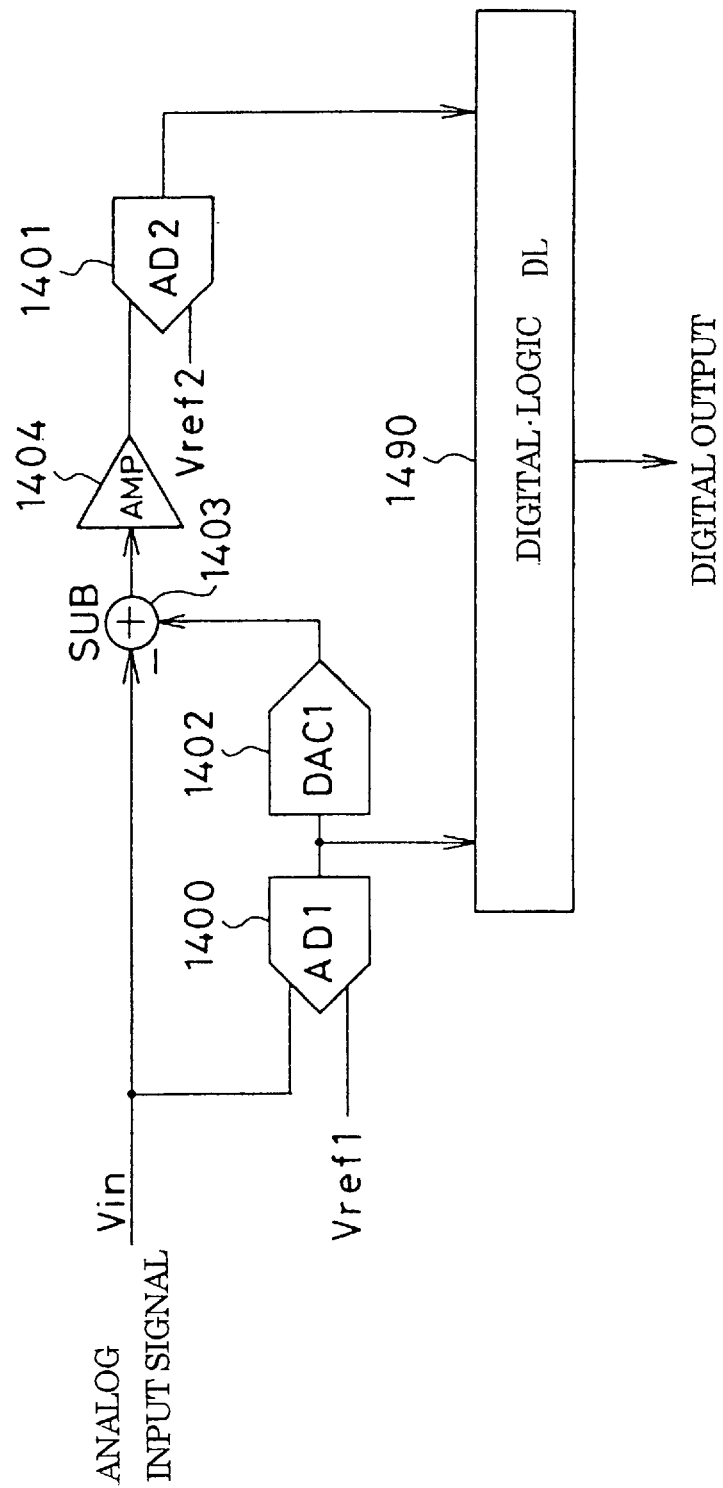
FIG. 16 is a diagram showing the construction of a serial-parallel A/D converter according to a first example of the prior art.
Figure 17:
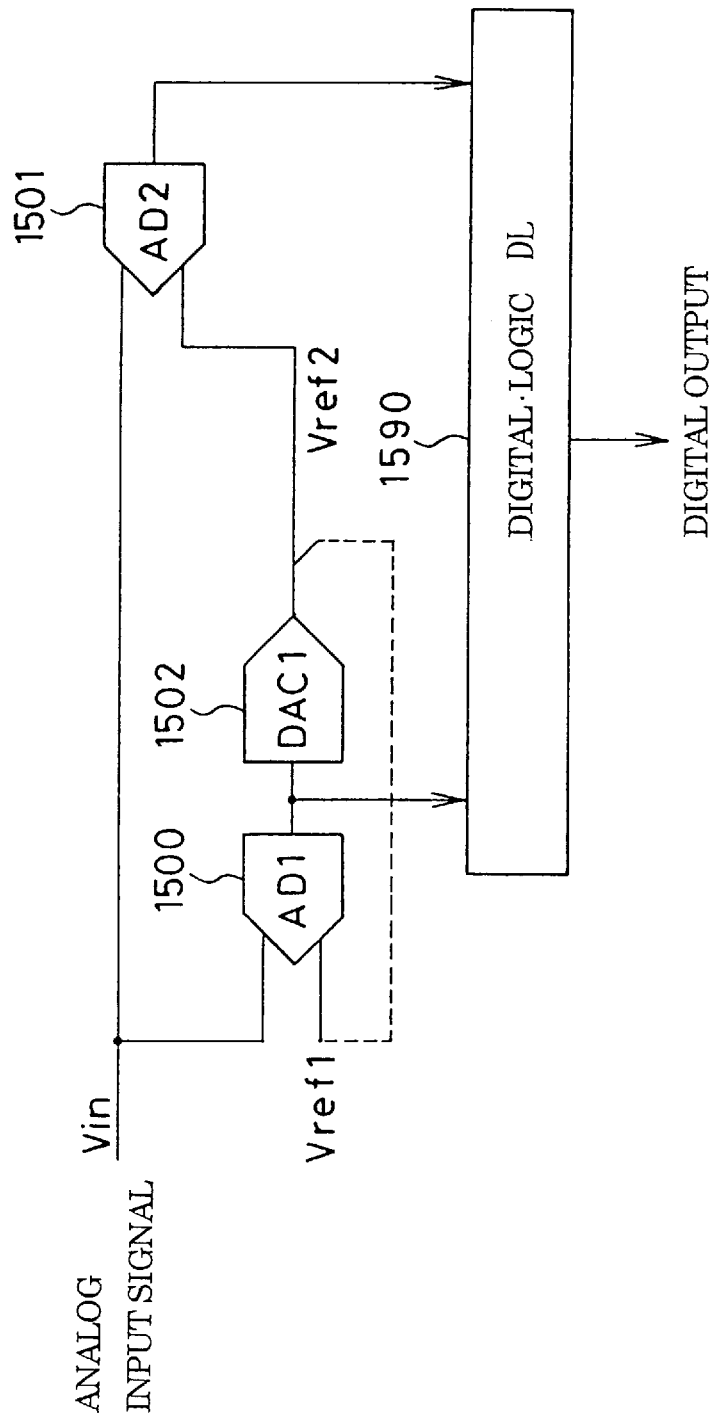
FIG. 17 is a diagram showing the construction of a serial-parallel A/D converter according to a second example of the prior art.
Figure 18:
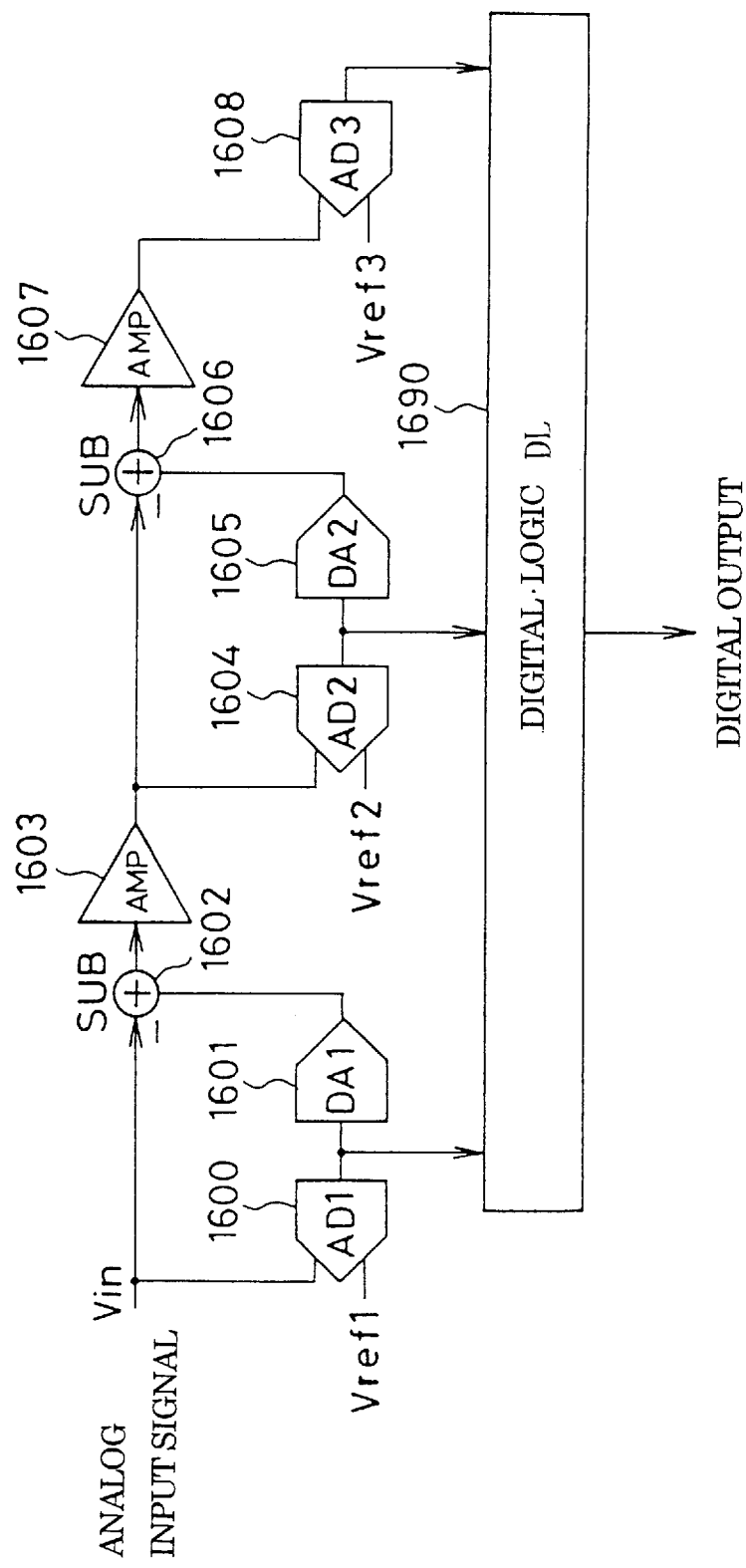
FIG. 18 is a diagram showing the construction of a serial-parallel A/D converter according to a third example of the prior art.

FIG. 1 illustrates the construction of a first embodiment of the present invention. As shown in FIG. 1, this embodiment is obtained by replacing the sub-A/D converter AD1 of the serial-parallel A/D converter which uses the explicit subtractor of the first example of the prior art shown in FIG. 16 with a serial-parallel A/D converter which does not use an explicit subtractor illustrated as a second example of the prior art in FIG. 17.

More specifically, as shown in FIG. 1, the sub-A/D converter AD1 of the first stage of the serial-parallel A/D converter which uses the explicit subtractor is constituted by a serial-parallel A/D converter which does not use an explicit subtractor (namely by a sub-A/D converter AD3, a D/A converter DAC3 and a sub-A/D converter AD4).

A specific example will be described to compare this embodiment with a case where the sub-A/D converter of the serial-parallel A/D converter which uses the explicit subtractor illustrated as the fourth example of the prior art is constituted by a serial-parallel A/D converter which uses an explicit subtractor.

Figure 19:
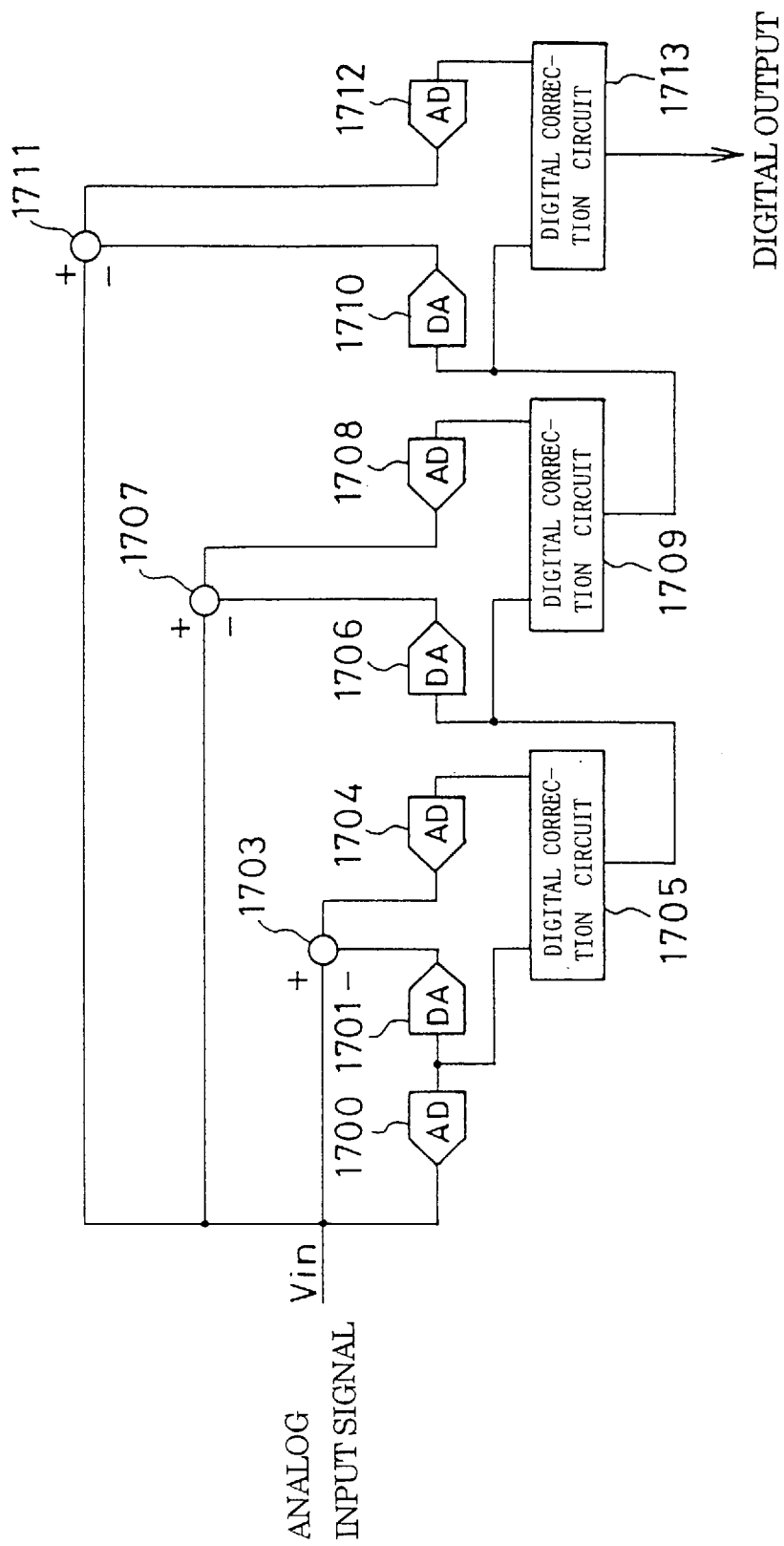
FIG. 19 is a diagram showing the construction of a serial-parallel A/D converter according to a fourth example of the prior art.

In order to make comparable as a two-stage configuration, it will be assumed that the three-stage arrangement of the fourth example of the prior art shown in FIG. 19 is devoid of a third stage formed of subtractor 1711, D/A converter 1710, A/D converter 1712 and digital correction circuit 1713.

On the assumption that the device is a 9-bit A/D converter, the A/D converters AD3, AD4, AD2 will each be set as 3-bit sub-A/D converters. In such case the D/A converter DAC2 will have a resolution of six bits and the D/A converter DAC1a resolution of three bits.

Further, A/D converters 1700, 1704, 1708 in the fourth example of the prior art may be assumed as 3-bit A/D converters.

If we let FS represent a full-scale amplitude, then the maximum difference produced by the subtractor 1703 of the first stage will be $FS/2^3$ in the case of the arrangement according to the fourth example of the prior art shown in FIG. 19. On the other hand, in the case of the present embodiment, the maximum difference produced by the subtractor (SUB) 103 is FS/26.

Accordingly, the difference obtained when the analog output of the D/A converter DAC1 is subtracted from the analog input voltage Vin by the subtractor SUB is smaller in this embodiment. Therefore, the difference between the amount of charge injection of a switch when the analog input voltage is sampled and the amount of charge injection of the switch when the output of the D/A converter is smaller, and the resulting subtraction error becomes smaller.

Thus, an advantage of this embodiment is that it exhibits a smaller subtraction error.

Another advantage of this embodiment is that the number of comparators is smaller in comparison with the first example of the prior art. That is, in a case where the A/D converter in the first example of the prior art is of 9-bit construction, the number of comparators will be 48 (16+32) if the A/D converter is a 9-bit serial-parallel A/D converter having four bits in the first stage and five bits in the second stage. On the other hand, the number of comparators is 24 (8+8+8) in this embodiment.

The A/D operation of the A/D converter according to this embodiment shown in FIG. 1 will now be described.

The sub-A/D converters AD3 (110), AD4 (112) and the subtractor SUB sample and hold the analog input signal Vin simultaneously. First, the sub-A/D converter AD3 A/D-converts the analog input signal Vin coarsely, and the D/A converter DAC2 (111) generates a comparison reference voltage Vdac1 for the sub-A/D converter AD4 on the basis of the resulting digital signal. The outputs of AD3 and AD4 are fed to a digital logic DC (190), while input signals of DAC2 and DAC1 are supplied via the digital logic DC.

The overall number of outputs from the D/A converter DAC2 is the total of the number of comparators in the A/D converter AD4 and the number of comparators in the A/D converter AD3. That is, the D/A converter DAC2 is used to supply a comparison reference voltage Vref for the A/D converter AD3.

An approximate analog reproduction signal is produced by the D/A converter DAC1 from the result of the A/D conversion performed by the A/D converters AD3 and AD4, the approximate analog reproduction signal is subtracted from the analog input signal Vin by the subtractor SUB, the output of the subtractor is amplified by an amplifier AMP (104) and the amplified signal is A/D-converted finely by the A/D converter AD2 (101). Finally, the results of the conversions performed by the A/D converters AD3, AD4, AD2 are outputted via the digital logic DL (190) upon being delayed and synchronized thereat.

Further, a sub-A/D converter module AD1 is made up of sub A/D converters AD3 and AD4 and a sub D/A converter DAC2 as shown in FIG. 1. Though the sub-A/D converter module AD1 in this embodiment is constituted by a two-stage serial-parallel A/D converter which does not use an explicit subtractor, it is obvious that the sub-A/D converter module AD1 can be constituted by a multiple-stage serial-parallel A/D converter module which does not use an explicit subtractor.

It should be noted that providing redundancy as by providing each sub-A/D converter and D/A converter with an extra number of bits and performing a digital correction by the digital logic DL (190) is well known. However, it is obvious that a digital correction can be introduced in the A/D converter according to this embodiment as well.

Figure 2:
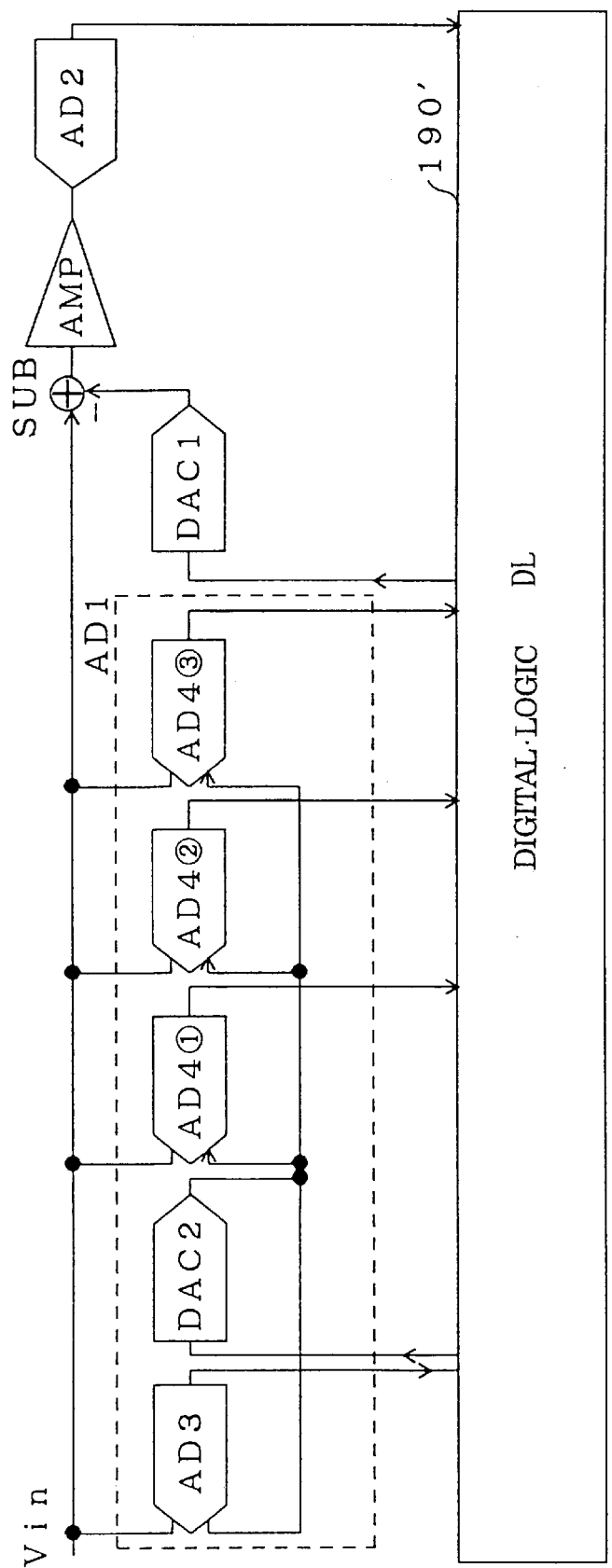
FIG. 2 is a diagram illustrating a modification of the first embodiment of the invention shown in FIG. 1.

FIG. 2 illustrates a modification of the first embodiment of the first aspect of the present invention. As shown in FIG. 2, a plurality of sub-A/D converters AD4 ① to AD4 ③ are provided for comparing the analog input signal Vin with the output of the D/A converter DAC2 and A/D-converting the analog input signal, and the D/A converter DAC2 D/A-converts the outputs also of the sub-A/D converters AD4 ①, AD4 ② but not the output of the sub-A/D converter AD4 ③ of t he final stage.

[Second Embodiment]

Figure 3:
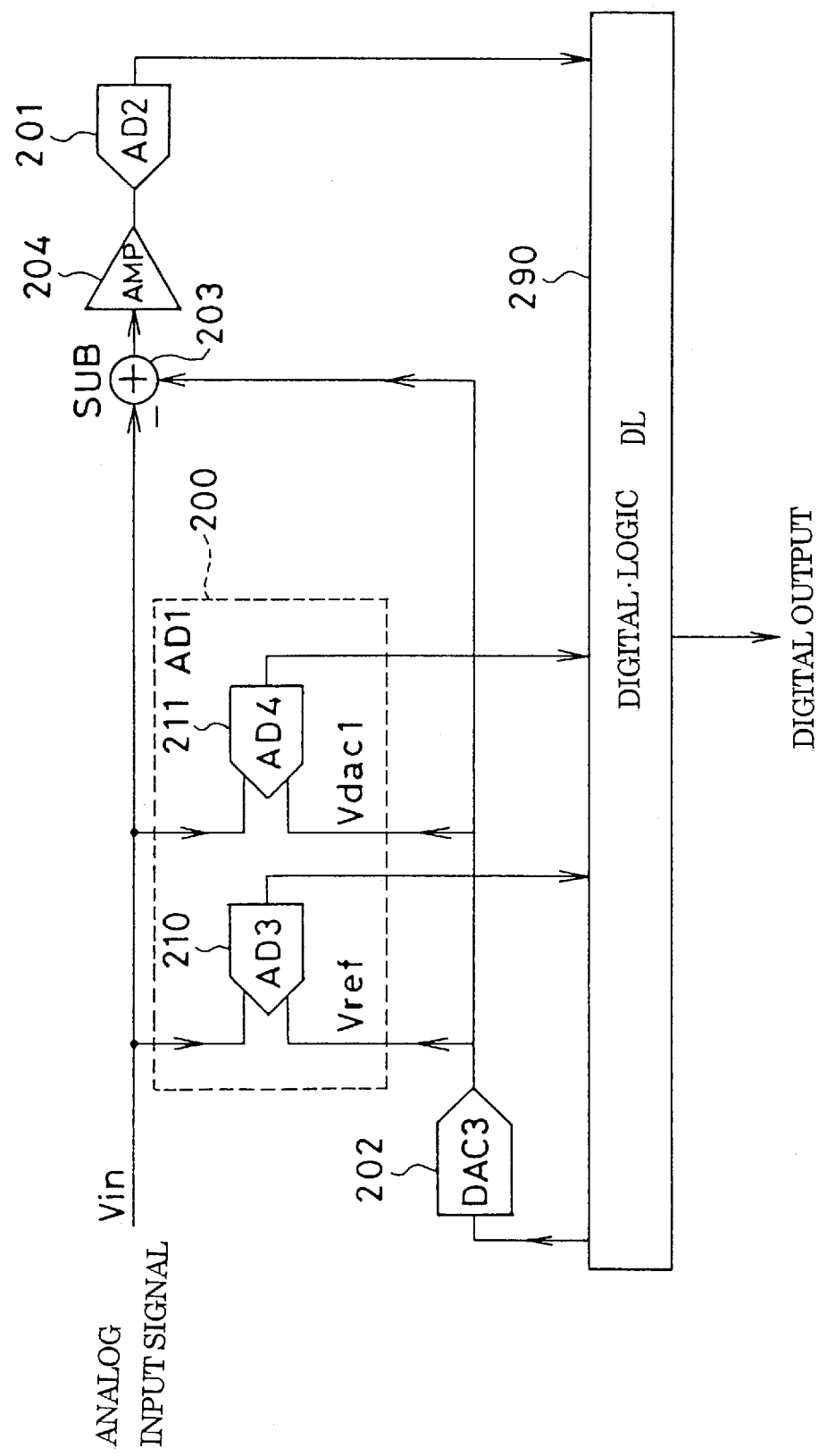
FIG. 3 is a diagram illustrating the construction of a second embodiment of the present invention.

FIG. 3 illustrates another embodiment of the first aspect of the present invention, in which the D/A converters DAC1 and DAC2 in the embodiment of FIG. 1 are replaced by a single D/A converter DAC3. Now the sub-A/D converter module AD1 is comprised of AD3 and AD4 wherein the outputs Vref, Vdac3 of DAC3 replace the outputs Vref, Vdac2 of DAC2 of FIG. 1, respectively.

Figure 4:
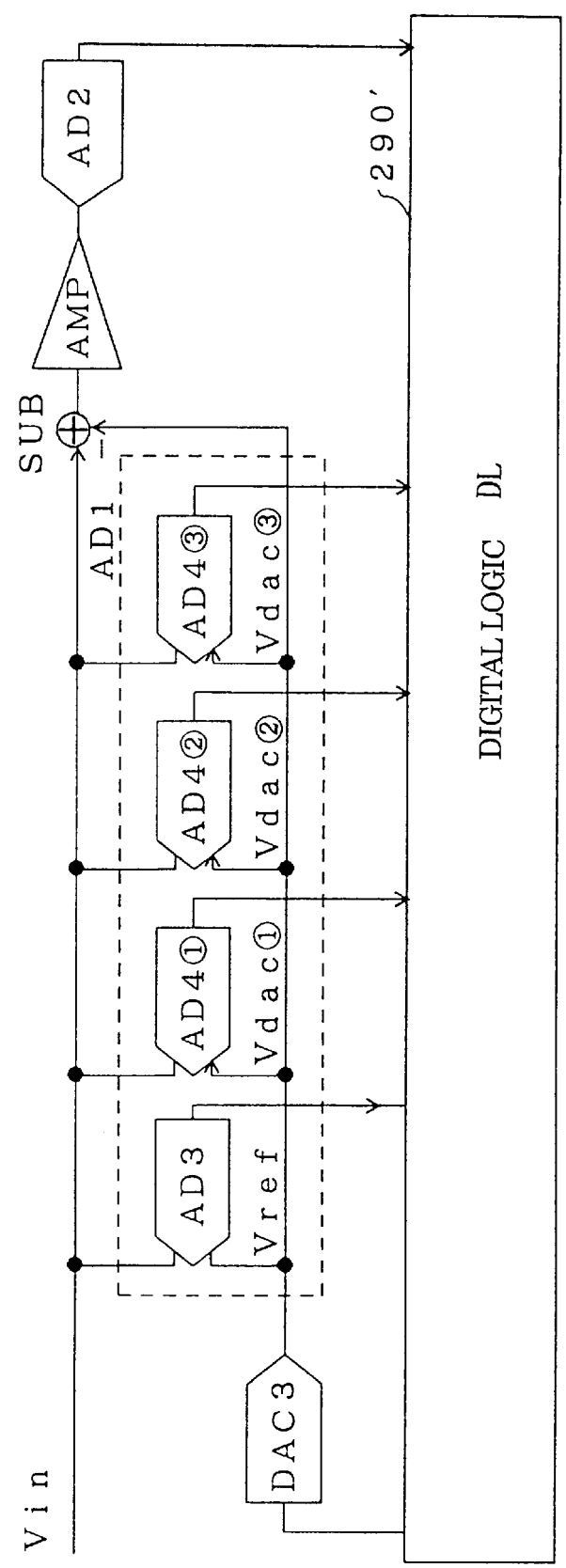
FIG. 4 is a diagram illustrating a modification of the second embodiment of the invention shown in FIG. 1.

This arrangement makes it possible to reduce the scale of the circuitry of the D/A converters and to use the same power supply for generating the comparison voltage. A result is an improvement in accuracy. In the case of the 9-bit A/D converter mentioned above, the resolution of the D/A converter DAC3 is six bits with a corresponding number of outputs thereof. FIG. 4 shows a modification in which the D/A converters DAC1, DAC2 in the embodiment of FIG. 2 are replaced by the single D/A converter DAC3.

[Third Embodiment]

Figure 5:
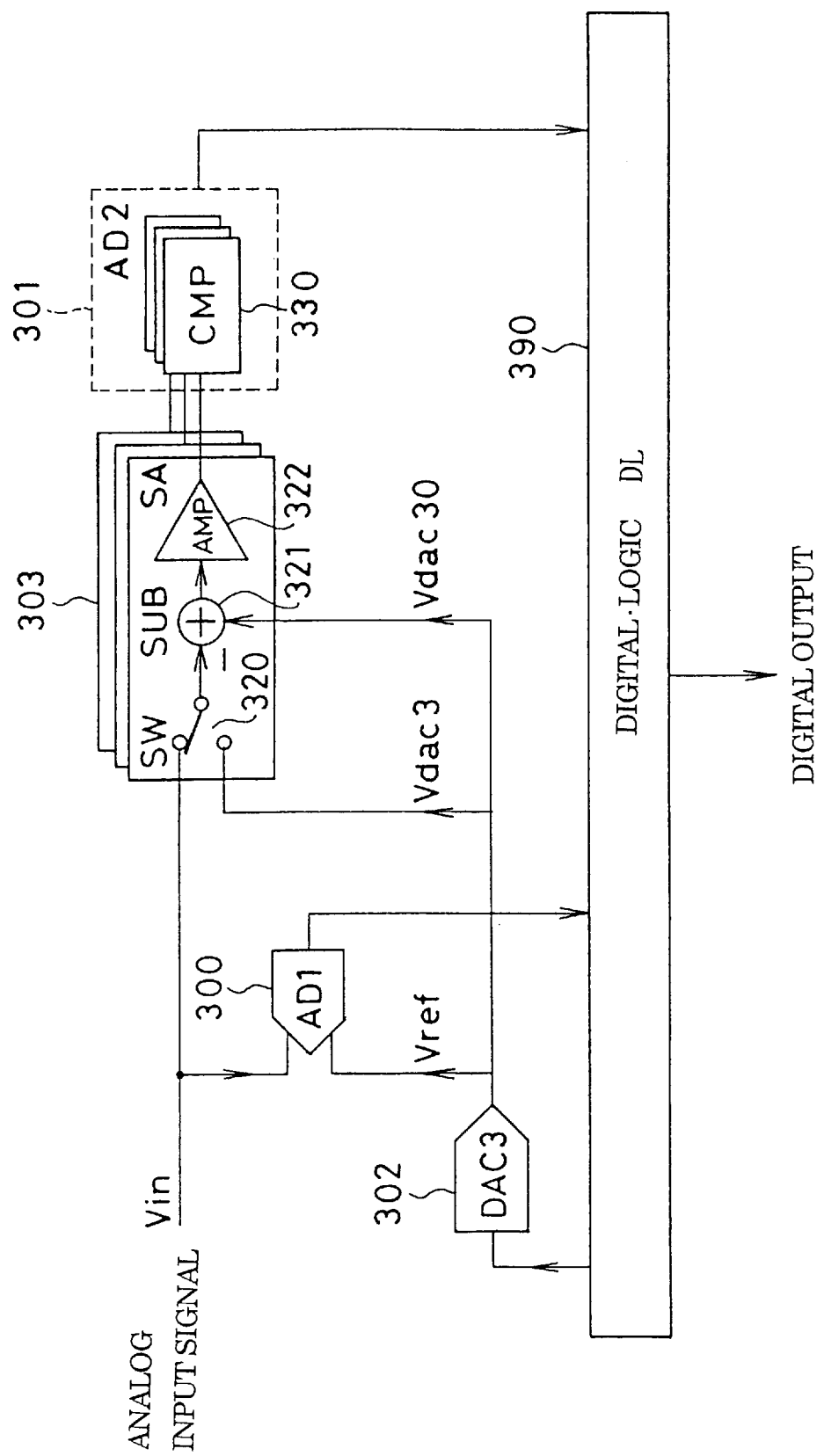
FIG. 5 is a diagram illustrating the construction of a third embodiment of the present invention.

FIG. 5 illustrates the construction of an embodiment according to the fourth aspect of the present invention.

As shown in FIG. 5, this embodiment has a subtractor SUB and amplifier AMP for each of k-number of comparators CMP (330) that constitute a sub-A/D converter module AD2 (301) of the second stage as compared with the serial-parallel A/D converter which has the explicit subtractor according to the prior art.

These subtractors and amplifiers shall be referred to collectively as "subtracting amplifier module" SA (303).

Each subtracting amplifier SA(i) selects the analog input signal Vin or an output Vdac3(i) of the D/A converter DAC3 (302) and subtracts an output Vdac30(i) of the D/A converter DAC3. Here the suffix i corresponds to the number (i) of the comparator.

The D/A converter DAC3 (302) generates the comparison reference voltages Vref, the number of which is equivalent to the number of comparators in the A/D converter AD1 of the first stage, and the outputs Vdac3(i) and Vdac30(i), the numbers of which are equivalent to the number of comparators in the A/D converter AD2 of the second stage. It should be noted that the number of types of output voltages of Vdac30 need not be k and may be less than k. It should also be noted that although the outputs of the D/A converter DAC3 in FIG. 5 are plural in number, these are illustrated collectively as a single output line in order to simplify the drawing.

The operation of the A/D converter according to this embodiment will now be described.

The analog input signal Vin is sampled and held by the A/D converter AD1 and subtracting amplifier module SA (303) simultaneously and is coarsely A/D-converted by the A/D converter AD1 (300). The D/A converter DAC3 (302) uses these results to determine the Vdac3 and Vdac30 that are to be output. The signal Vdac3 corresponds to the comparison reference voltage of the A/D converter AD1. The subtracting amplifier module SA subtracts Vdac30 from the held analog input signal Vin and amplifies the difference at AMP (322), and the comparator CMP (330) constituting the A/D converter AD2 (301) samples and holds the output signal of the subtracting amplifier module SA, namely the signal $A\times(Vin-Vdac30)$ where A represents the amplification factor of the amplifier AMP (322).

Next, the subtracting amplifier module SA samples and holds the output Vdac 3 of the D/A converter DAC3, subtracts Vdac30 from Vdac3 and then amplifies the difference at AMP (322). The comparator CMP (330) constituting the A/D converter AD2 (301) samples and holes the output signal of the subtracting amplifier SA, namely the signal $A\times(Vdac3-Vdac30)$ where A represents the amplification factor of the amplifier AMP.

Accordingly, the signals $A\times(Vin-Vdac30)$ and $A\times(Vdac3-Vdac30)$ enter the comparator CMP by time sharing so that the comparator may perform a comparison.

Since this is equivalent to comparing the analog input signal Vin and Vdac3(i), the sub-A/D converter AD2 of the second stage performs a fine A/D conversion.

Thus, as will be apparent from the foregoing operation, in this embodiment the analog input signal Vin and the comparison reference voltage pass through the amplifier AMP in time-shared fashion, as a result of which the accuracy of the amplification factor of amplifier AMP has no influence upon the comparison operation of the comparator. Accordingly, almost no accuracy is demanded of the amplification factor of the amplifier AMP as long as the output of the amplifier AMP does not saturate, the amplification factor (gain) of the amplifier AMP does not become inadequate and the comparator does not become inoperative. Thus, in this embodiment, the accuracy demanded of the amplification factor of the amplifier AMP is reduced by a wide margin.

Further, Vdac30 is set so as to make $|Vdac3-Vdac30|$ as small as possible in order to prevent the output of the amplifier AMP from saturating.

In this embodiment, a switch SW (320) which selects the analog input signal Vin or the output of the D/A converter DAC3 and enters the selected signal into the subtractor SUB is illustrated as being separate from the subtractor SUB in order to facilitate an understanding of operation. However, an arrangement may be adopted in which this input selecting function is provided within the circuitry of the subtractor SUB.

[Fourth Embodiment]

Figure 6:
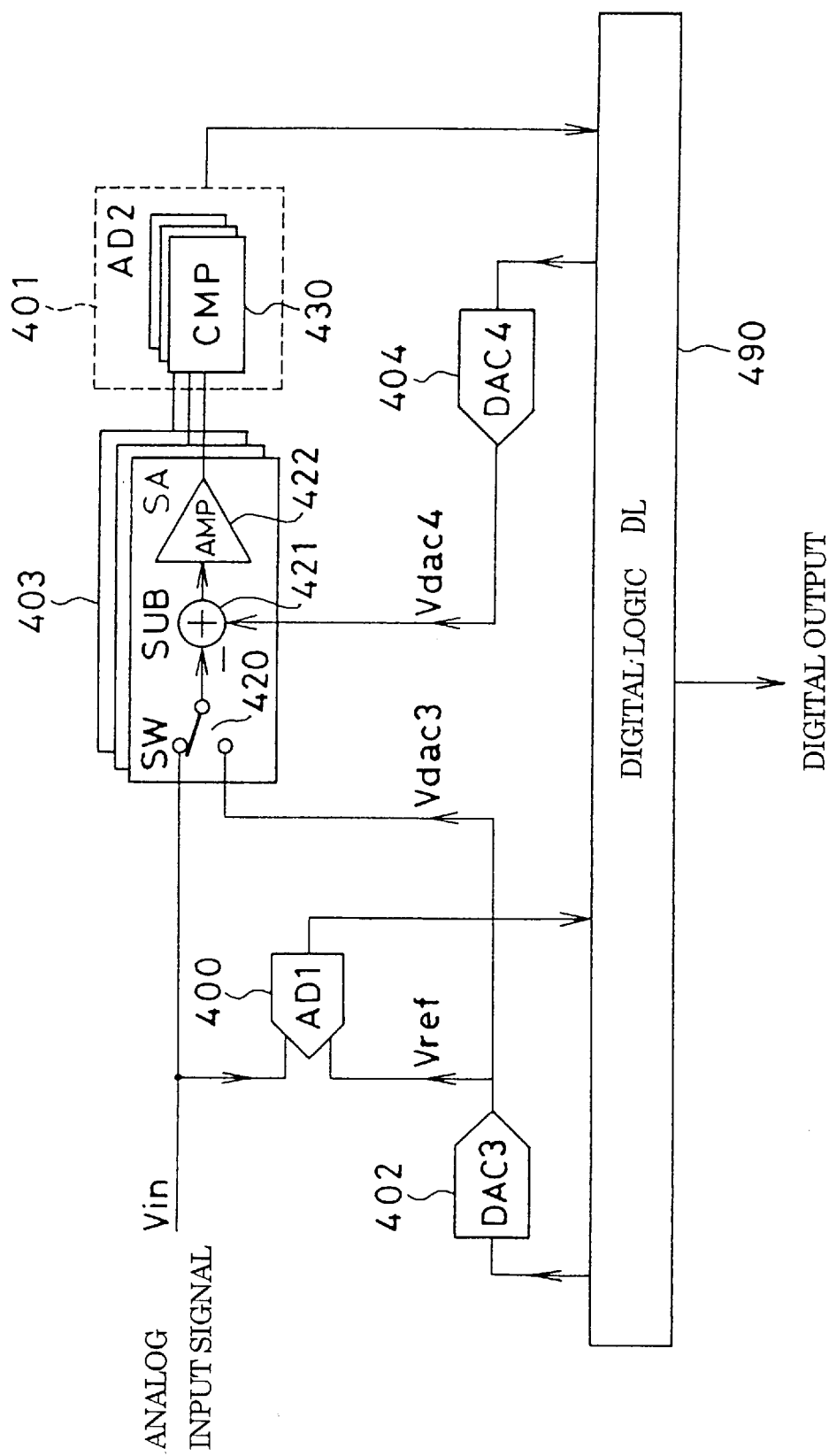
FIG. 6 is a diagram illustrating the construction of a fourth embodiment of the present invention.

FIG. 6 illustrates the construction of a modified embodiment of the fourth aspect of the present invention. As shown in FIG. 6, the arrangement is such that the supply of the voltage Vdac30 from the D/A converter DA3 in the embodiment of FIG. 5 is performed by a separate D/A converter DAC4 (404), where the voltage is represented by Vdac4. DAC4 receives input from DL (490).

When the operation described in the foregoing embodiment is performed solely by the D/A converter DAC3, the output of the D/A converter DAC3 needs to change in a frequent and complicated manner. As a consequence, there are instances where settling time becomes a problem.

Owing to the introduction of the separate D/A converter DAC4 in this embodiment, the output of the D/A converter DAC3 will not change during the time that the sub-A/D converter AD2 of the second stage performs the A/D conversion. As a result, an advantage of this embodiment is that the settling time of the D/A converter DAC3 is relaxed.

[Fifth Embodiment]

Figure 7:
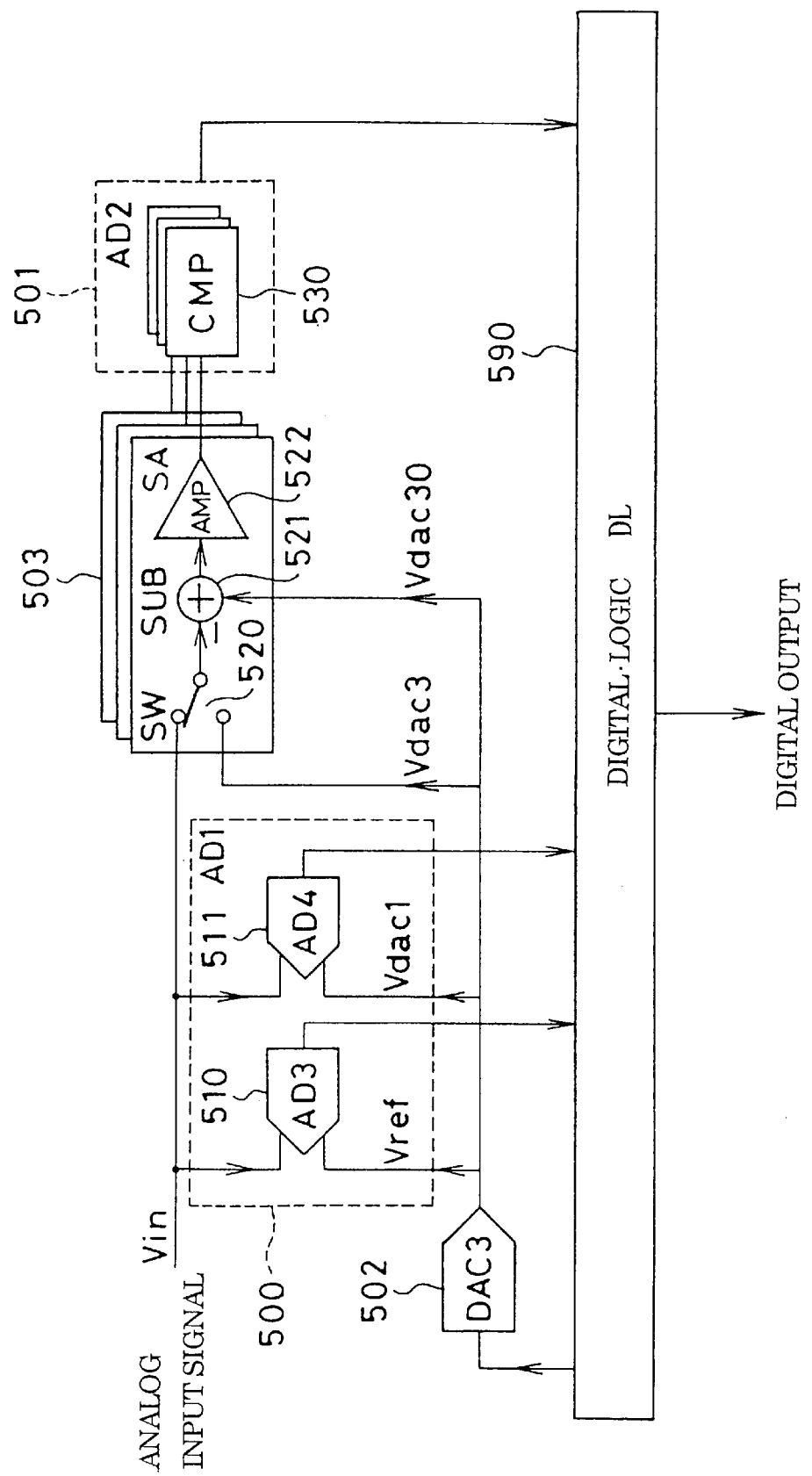
FIG. 7 is a diagram illustrating the construction of a fifth embodiment of the present invention.

FIG. 7 illustrates an example of a construction according to another embodiment of the present invention. Here the A/D converter module AD1 and D/A converter module DAC3 of the first stage of the second embodiment (see FIG. 3) and the subtracting amplifier module SA of the fourth embodiment (see FIG. 6) have been combined.

[Sixth Embodiment]

Figure 8:
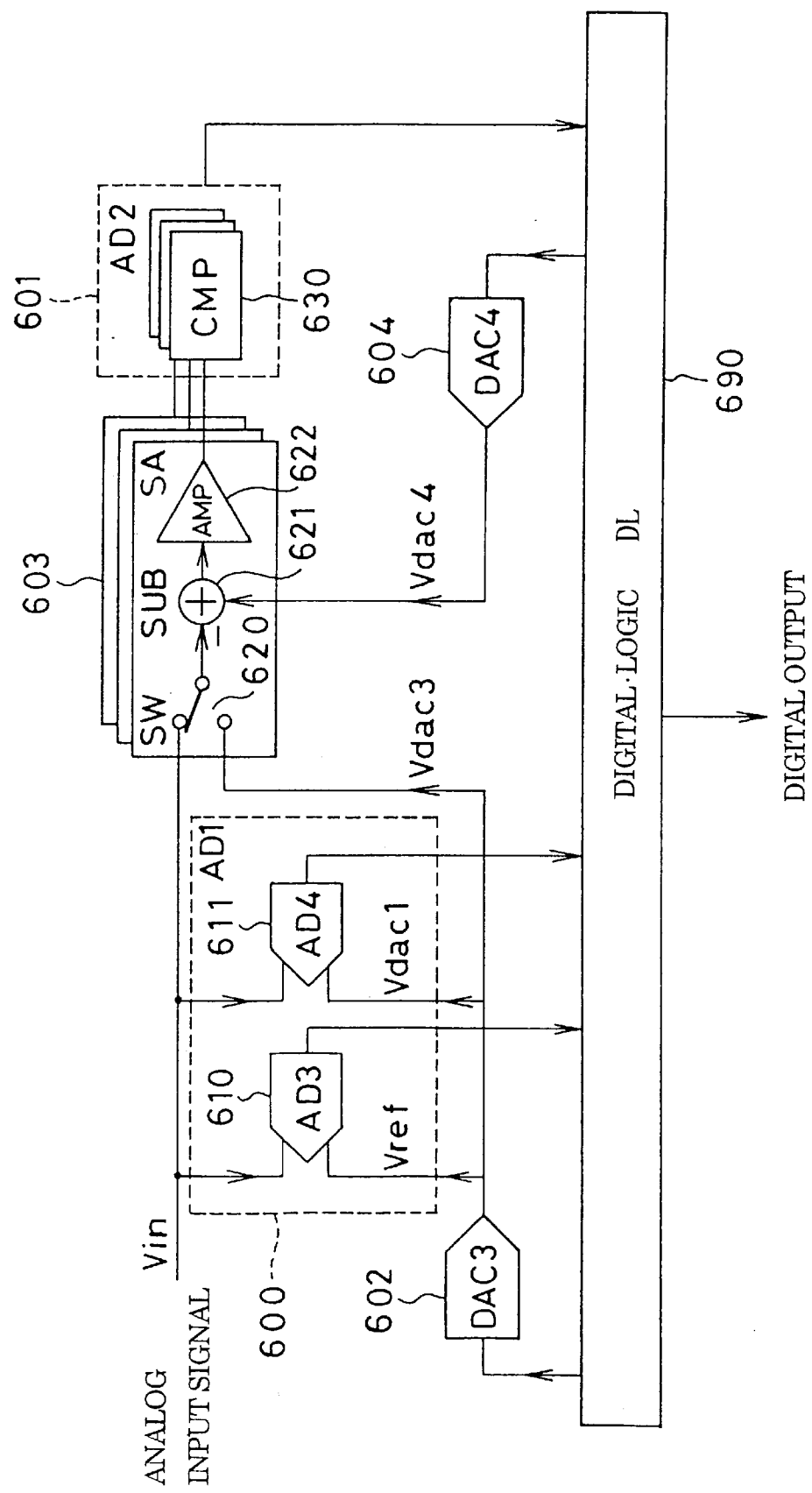
FIG. 8 is a diagram illustrating the construction of a sixth embodiment of the present invention.

FIG. 8 illustrates an example of a construction according to another embodiment of the present invention. Here the A/D converter module AD1 and D/A converter DAC3 of the first stage of the second embodiment (see FIG. 3) and the subtracting amplifier module SA of the fourth embodiment (see FIG. 6) have been combined.

The difference between the embodiments shown in FIGS. 7 and 8 is the same as the difference between the embodiments of FIGS. 5 and 6, namely the fact that the D/A converter DAC4 is provided in FIG. 8 in order to relax the settling time of the D/A converter DAC3 whereas the D/A converter DAC4 is not provided in FIG. 7.

In the case of a 9-bit A/D converter in the embodiment of FIG. 8, the converter would be constructed as follows:

The sub-A/D converters AD3, AD4 and AD2 are each set as 3-bit A/D converters, as a result of which the sub-A/D converter module AD1 comprises six bits.

The D/A converter DAC3 has a precision and resolution of nine bits, and the number of outputs thereof is equivalent to nine bits. The D/A converter DAC4 has a precision of nine bits and the number of outputs thereof is equivalent to three bits or less.

By virtue of the arrangements illustrated in FIGS. 7 and 8, the precision of the amplifier can be reduced and a highly precise A/D conversion can be performed even with a low power supply voltage while an increase in the number of comparators can be suppressed to a degree equivalent to the multiple-stage serial-parallel A/D converter of the prior art.

Further, in these embodiments, the sub-A/D converter module AD1 is constituted by the two-stage serial-parallel A/D converter which does not use an explicit subtractor. However, it can be constituted by the multiple-stage serial-parallel A/D converter which does not use an explicit subtractor.

[Seventh Embodiment]

Figure 9:
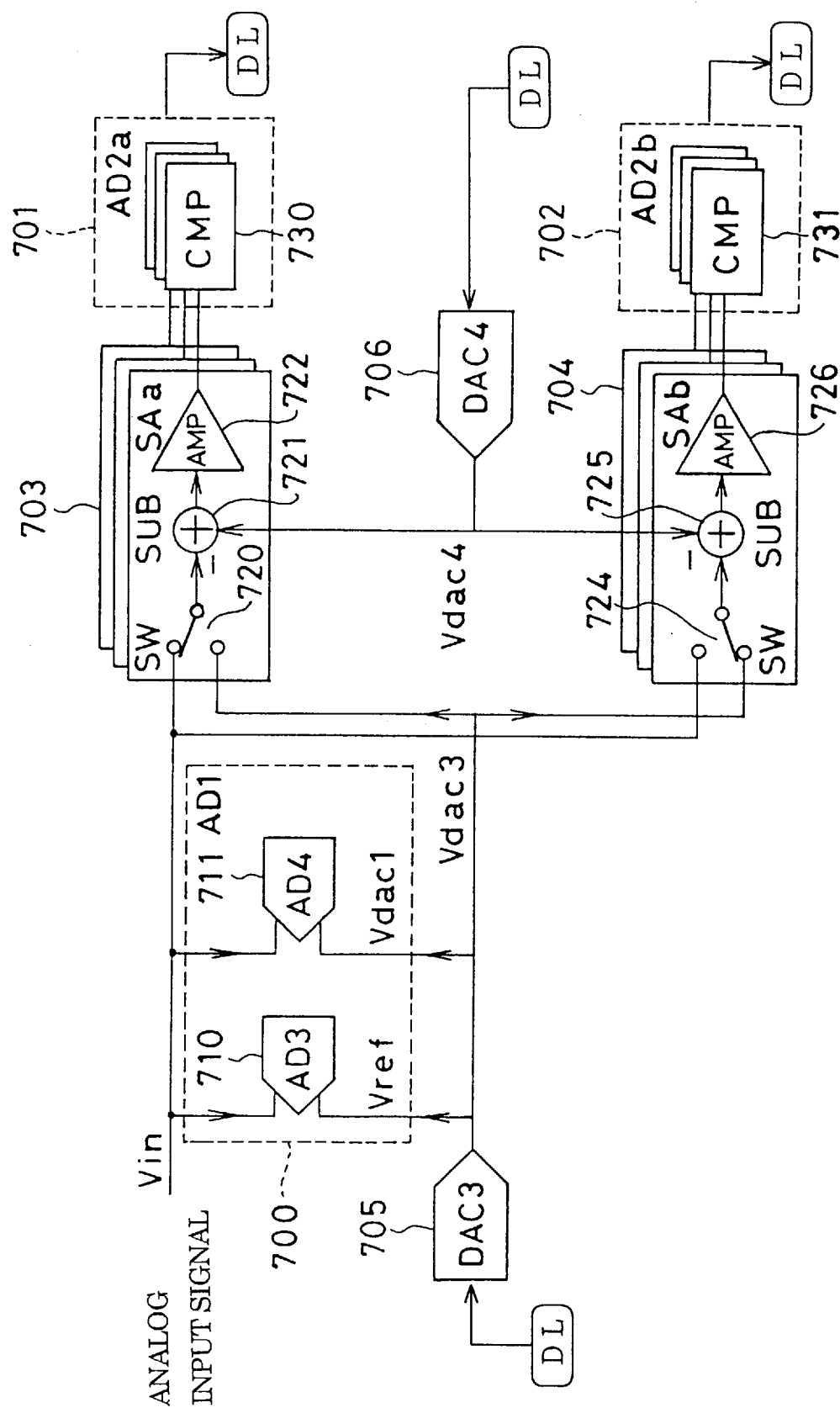
FIG. 9 is a diagram illustrating the construction of a seventh embodiment of the present invention.

FIG. 9 illustrates an example of an arrangement in which the second embodiment (see FIG. 3) and the fourth embodiment (see FIG. 6) have been combined. It should be noted that in order to avoid complexity, some of the digital inputs and outputs of the A/D converters and D/A converters are abbreviated and the digital logic is shown by a sign DL.

As shown in FIG. 9, this embodiment is such that the sub-A/D converters AD2 of the second stage and the plurality of subtracting amplifiers modules SA are provided in each of two unit systems. In other words, this embodiment has an A/D converter AD2a and a subtracting amplifier SAa in one unit system (line) and an A/D converter AD2b and a subtracting amplifier SAb in the other unit system (line).

In the case of the arrangement shown in FIGS. 5, 6, 7 and 8, it is necessary that the analog input signal Vin be sampled and held by the A/D converter module AD1 and subtracting amplifier module SA simultaneously. Consequently, until the processing executed by the subtracting amplifier module SA ends, the sampling of the analog input signal Vin that is to be converted next cannot take place.

In this embodiment, the subtracting amplifier module SA and the A/D converter AD2 of the second stage are provided in each of two unit systems, as illustrated in FIG. 9. As a result, while A/D conversion processing is being carried out in one unit system, the other unit system samples the next analog input signal Vin. By virtue of this alternating operation (interleaving), the conversion speed of the serial-parallel A/D converter can be raised.

According to this embodiment, a case in which two unit systems are provided is exemplified. However, an arrangement may be adopted more than two unit systems are interleaved.

Figure 10:
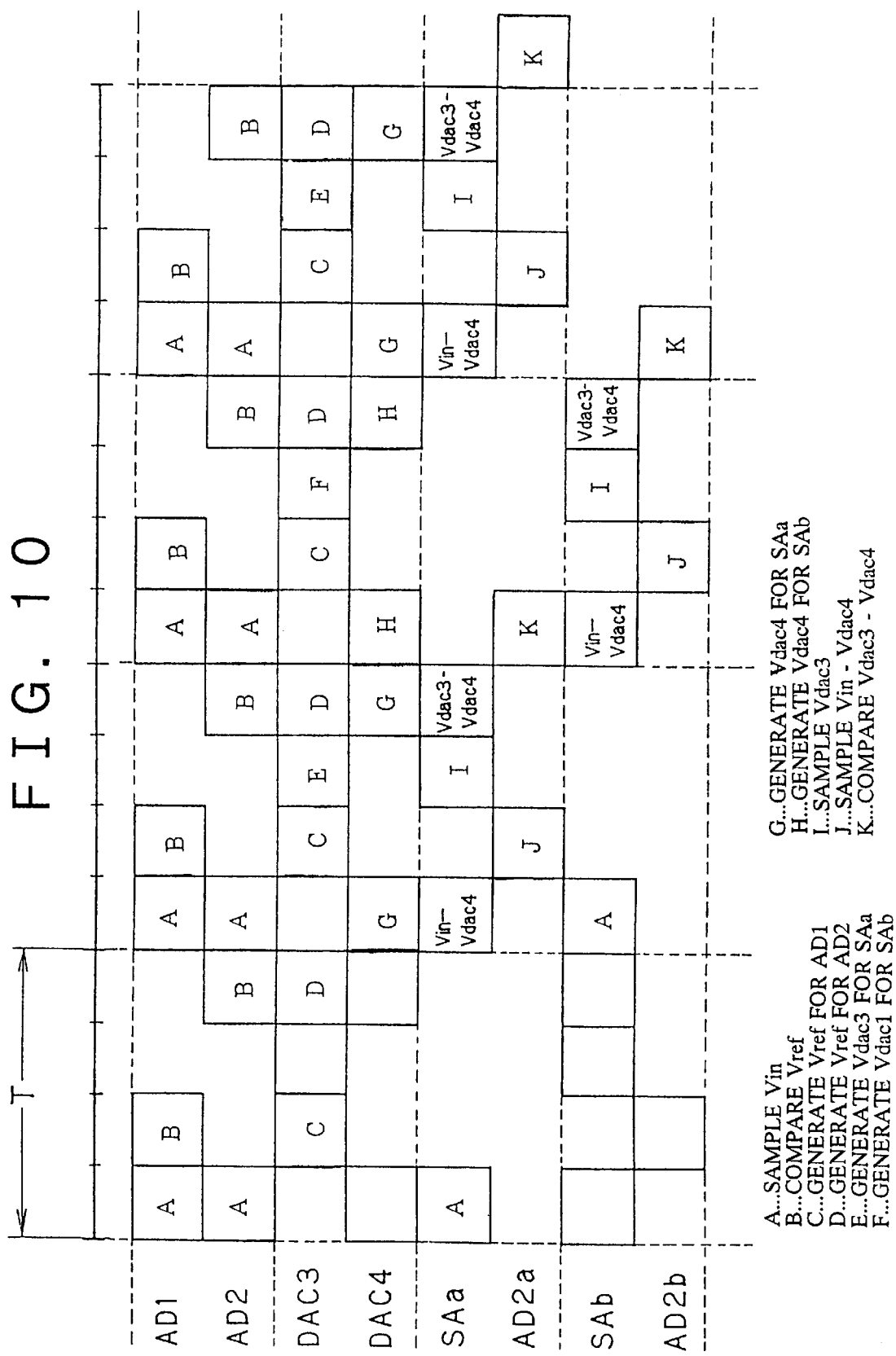
FIG. 10 is a diagram illustrating an example of operation timing according to an embodiment of the present invention.

FIG. 10 is a diagram illustrating an example of the operation timing of the serial-parallel A/D converter shown in FIG. 9.

In a case where interleaving is not carried out (that is, when the subtracting amplifier module SAb and the A/D converter AD1b, for example, are not provided), the conversion period of A/D conversion is required to be 2.25 T, namely the length of time from the "sampling of Vin" by the subtracting amplifier module SAa to the "comparison of Vdac3 and Vdac4" by the A/D converter AD1a, as shown in FIG. 10. When interleaving is performed, however, the apparent conversion period (throughput) becomes T. Thus, operation is speeded up.

Further, by performing interleaving, an advantage gained is an increase in the utilization efficiency of the sub-A/D converter module AD1 of the first stage and of the D/A converter DAC4 which outputs Vdac4 to the subtractor SUB.

Figure 11:
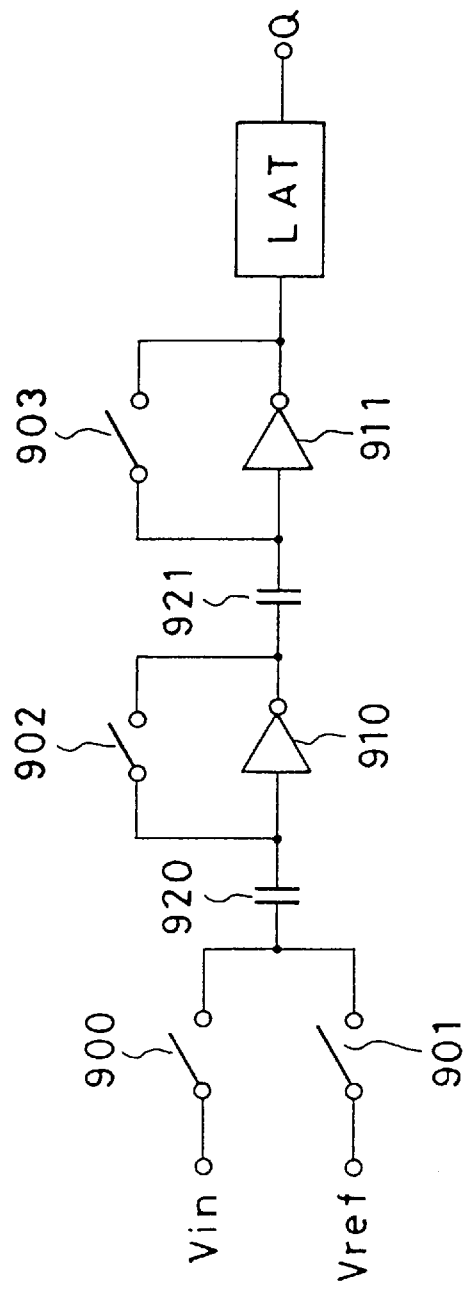
FIG. 11 is a diagram showing the construction of a comparator according to an embodiment of the present invention.
Figure 12:
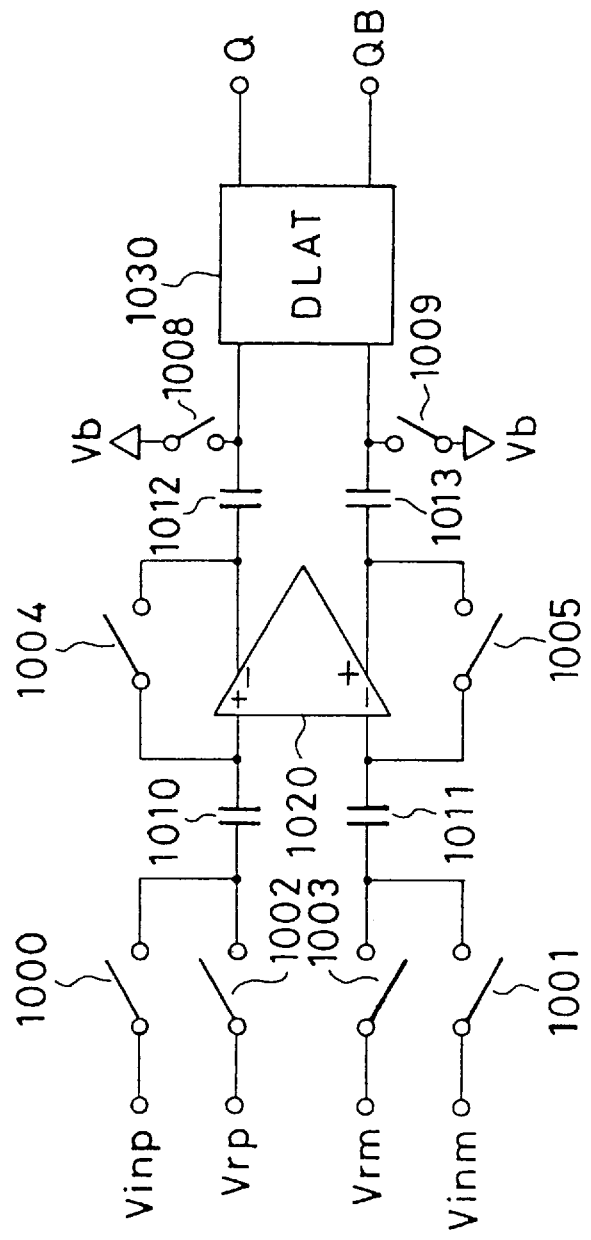
FIG. 12 is a diagram showing the construction of a differential comparator according to an embodiment of the present invention.

FIGS. 11 and 12 illustrate embodiments of comparators, which are applicable to the present invention, capable of entering and comparing the analog input signal Vin and comparison reference voltage Vref by time sharing. By constructing each of the sub-A/D converters using comparator CMP of this kind, no special sample-and-hold circuits need be provided.

The comparator depicted in FIG. 11 relies upon chopper-type inverters. In an example of the comparison operation, first switches 900, 902 and 903 are closed to sample and hold the input signal Vin and, at the same time, to set the operating points of inverters 910, 911. Next, the switches 900, 902 and 903 are opened and a switch 901 is closed to sample the comparison reference voltage Vref, compare the signal and amplify the results, whereupon the amplified signal is latched by a latch circuit LAT to obtain a digital output Q.

The comparator shown in FIG. 12 is a differential comparator that uses a differential amplifier. In an example of the comparison operation, first switches 1000, 1004, 1005, 1008 and 1009 are closed to sample and hold differential analogue input signals Vinp, Vinm and, at the same time, to set the operating point of a differential amplifier 1020 and absorb offset voltage. Next, the switches 1000, 1004, 1005, 1008 and 1009 are opened and switches 1002, 1003 are closed to sample differential comparison reference voltages Vrp, Vrm, compare the signals and amplify the results, whereupon the amplified signals are latched by a differential latch circuit DLAT to obtain complimentary digital outputs Q, QB. Vb repserents bias voltage.

Figure 13:
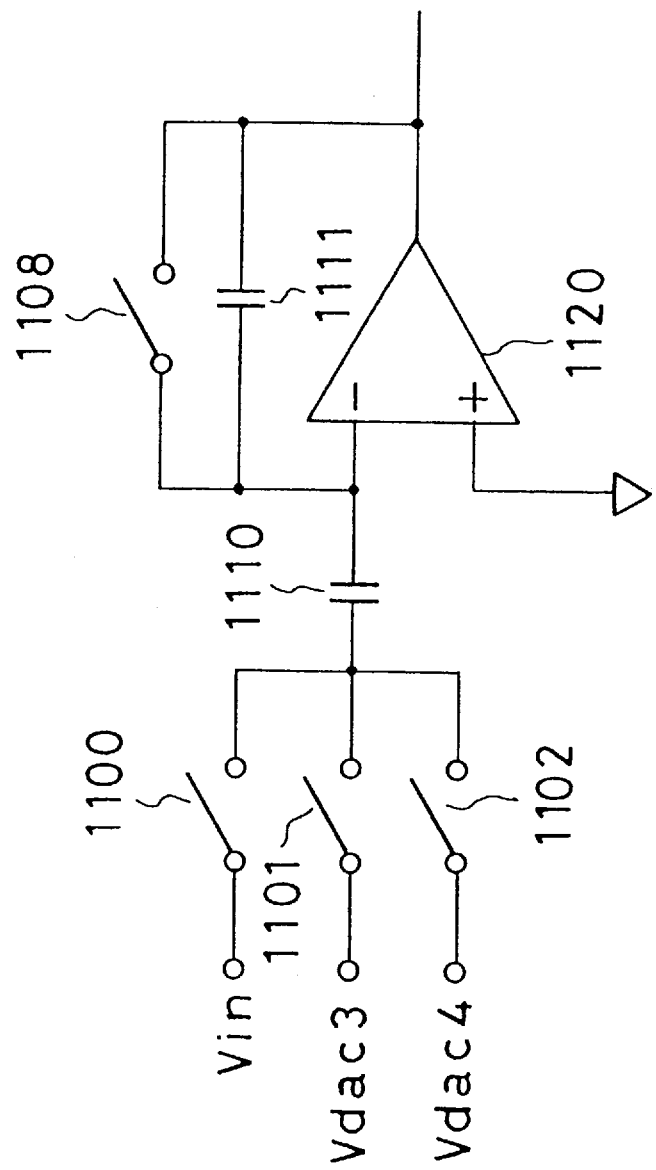
FIG. 13 is a diagram showing the construction of a subtractor/amplifier according to an embodiment of the present invention.

FIG. 13 illustrates, as an embodiment of the invention, an example of the construction of the subtracting amplifier module SA having a sample-and-hold function. Switches 1100, 1101, 1102 shown in FIG. 13 are switches for sampling the analog input signal Vin and the D/A converter outputs Vdac3, Vdac4.

The operating point of the input terminal of an amplifier 1020 is set by a switch 1103. The amplification factor can be set 20 by the capacitance ratio between capacitors 1110 and 1111.

Figure 14:
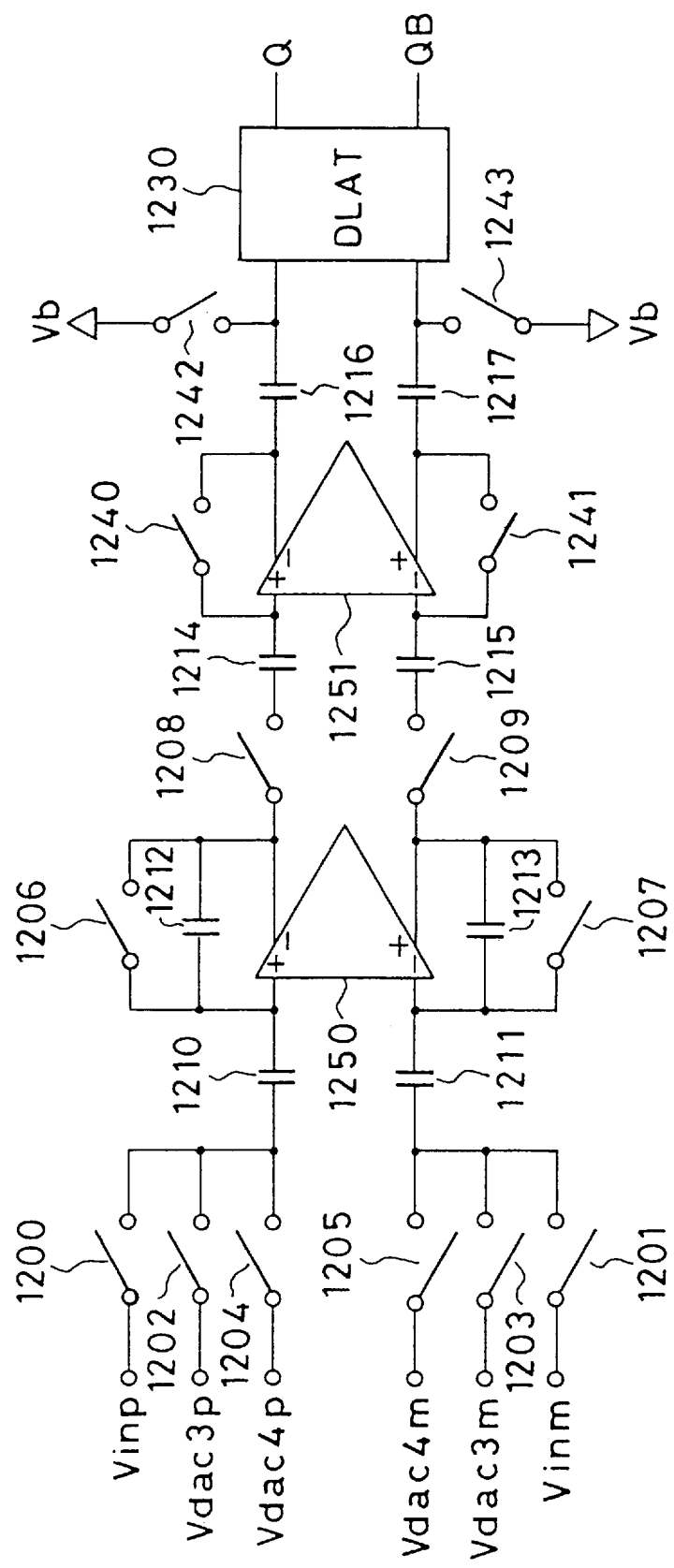
FIG. 14 is a diagram showing the construction of a differential subtractor/amplifier according to an embodiment of the present invention.

FIG. 14 is a diagram showing an embodiment of the circuit construction of a differential arrangement in which the subtracting amplifier module SA and comparator CMP are integrated according to the present invention. This circuit makes the subtracting amplifier module of FIG. 13 a differential amplifier and connects it to the comparator shown in FIG. 12.

By virtue of this arrangement, one set of the subtracting amplifier module SA and comparator CMP in the embodiment of FIG. 5, for example, can be constructed. Further, in the differential comparator illustrated in FIG. 12, four switches, namely the switches 1000, 1001, 1002 and 1003 are required. However, by allowing the input switch of the subtracting amplifier module to be used jointly by these elements, only two switches, namely 1208 and 1209, will suffice in the arrangement of FIG. 14.

Figure 15:
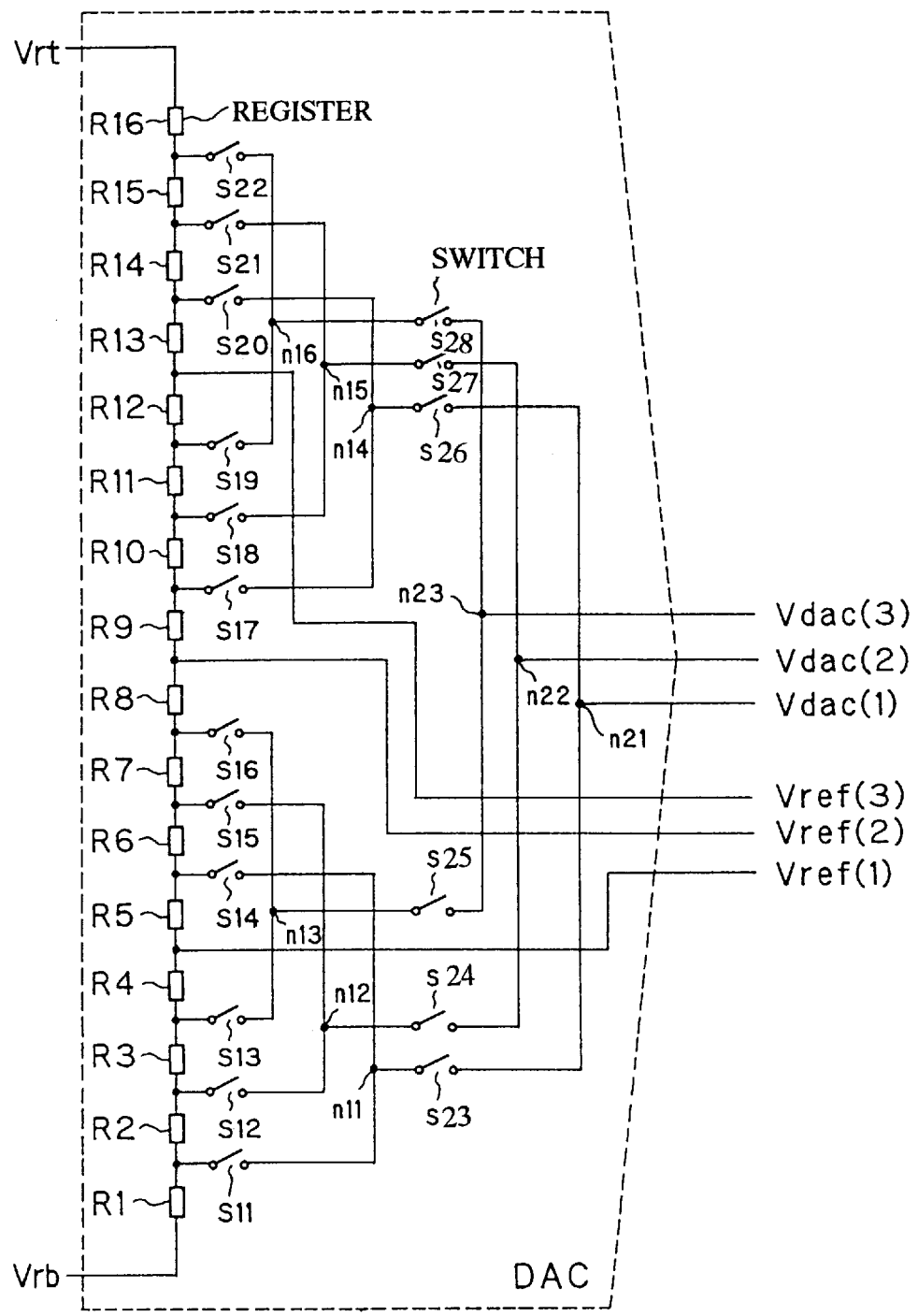
FIG. 15 is a diagram showing the construction of a D/A converter according to an embodiment of the present invention.

FIG. 15 is a diagram showing an example of the construction of a D/A converter according to an embodiment of the present invention. This is referred to generally as a resistor-string D/A converter.

As shown in FIG. 15, reference voltages Vrt, Vrb are divided by resistors R1 to R16, and the terminal voltages are selected by switches S11 to S28 controlled by digital values and output signals of desired levels Vref (1) to (3) or Vdac (1) to (3).

It goes without saying that D/A converters of various well-known types other than that of FIG. 15 can be used in the present invention.

Furthermore, in order to raise the speed of the A/D converter of the present invention, the invention described in the specification of e.g. Japanese Patent Application No. 7-254724 (now Kokai Publication No. JP-A-Hei 9-83369) can be applied (the entire disclosure thereof being incorporated herein by reference thereto. More specifically, switches are provided for connecting internal terminals of the internal D/A converter of the A/D converter according to the present invention with the analog input signal Vin, and each terminal voltage of the D/A converter is initialized by the analog input signal voltage, thereby shortening the settling time of the D/A converter.

As many apparently widely different embodiments of the present invention can be made without departing from the spirit and scope thereof, it is to be understood that the invention is not limited to the specific embodiments thereof except as defined in the appended claims.

What is claimed is:

1. A serial-parallel A/D converter comprising:
    a first sub-A/D converter module A/D-converting a first analog input signal;
    a first D/A converter D/A-converting an output of said first sub-A/D converter module;
    a first subtractor subtracting an output of said first D/A converter from the first analog input signal;
    a first amplifier amplifying an output of said first subtractor; and
    a second sub-A/D converter A/D-converting an output of said first amplifier;
    said the first sub-A/D converter module including:
        a third sub-A/D converter A/D-converting the first analog input signal;
        a second D/A converter D/A-converting an output of the third sub-A/D converter; and
        a fourth sub-A/D converter comparing the first analog input signal and an output of said second D/A converter and operating A/D-convertion.

2. A serial-parallel A/D converter comprising:
    a first sub-A/D converter module A/D-converting a first analog input signal;
    a first D/A converter D/A-converting an output of said first sub-A/D converter module;
    a first subtractor subtracting an output of said first D/A converter from the first analog input signal;
    a first amplifier amplifying an output of said first subtractor; and
    a second sub-A/D converter module A/D-converting an output of said first amplifier;
    said the first sub-A/D converter module including:
        a third sub-A/D converter A/D-converting the first analog input signal;
        a second D/A converter D/A-converting an output of the third sub-A/D converter; and
        one or a plurality of fourth sub-A/D converters comparing the first analog input signal and an output of said second D/A converter and operating A/D-convertion;
    wherein said second D/A converter D/A-converts the output of said third sub-A/D converter and, in a case where said second sub-A/D converter has the plurality of fourth sub-A/D converters, D/A-converts outputs from all of the fourth sub-A/D converters other than that of the final stage.

3. The A/D converter according to claim 1, wherein said first D/A converter and said second D/A converter are formed of a single third D/A converter.

4. The A/D converter according to claim 2, wherein said first D/A converter and said second D/A converter are replaced by a single third D/A converter.

5. A serial-parallel A/D converter comprising:
    a first sub-A/D converter module A/D-converting a first analog input signal;
    a third D/A converter D/A-converting an output of said first sub-A/D converter module;
    a first subtractor subtracting an output of said third DIA converter from the first analog input signal;
    a first amplifier amplifying an output of said first subtractor; and
    a second sub-A/D converter A/D-converting an output of said first amplifier;
    said the second sub-AID converter including comparators capable of receiving and comparing input signals and comparison reference signals by time sharing;
    wherein as said first subtractor, there are provided a second subtractor selecting the first analog input signal or the output of said third D/A converter and subtracting the output of said third D/A converter from the selected signal, and a second amplifier amplifying an output of said second subtractor; and
    a plurality of said second subtractors and a plurality of said second amplifiers are provided so as to correspond to respective ones of the comparators constituting said second sub-A/D converter.

6. The A/D converter according to claim 5, further comprising a fourth D/A converter D/A-converting the output of said first sub-A/D converter;
    said second subtractor selecting the first analog input signal or the output of said third D/A converter and subtracting an output of said fourth D/A converter from the selected signal.

7. The A/D converter according to claim 1, further comprising:
    a fourth D/A converter D/A-converting the output of said first sub-A/D converter;
    as said first subtractor, a second subtractor selecting the first analog input signal or the output of said third D/A converter and subtracting the output of said fourth D/A converter from the selected signal, and
    a second amplifier amplifying an output of said second subtractor;
    wherein a plurality of said second subtractors and a plurality of said second amplifiers are provided so as to correspond to respective ones of the comparators constituting said second sub-A/D converter.

8. The A/D converter according to claim 2, further comprising:

a fourth D/A converter D/A-converting the output of said first sub-A/D converter;

as said first subtractor, a second subtractor selecting the first analog input signal or the output of said third D/A converter and subtracting the output of said fourth D/A converter from the selected signal, and a second amplifier amplifying an output of said second subtractor;

wherein a plurality of said second subtractors and a plurality of said second amplifiers are provided so as to correspond to respective ones of the comparators constituting said second sub-A/D converter.

9. The A/D converter according to claim 3, further comprising:

a fourth D/A converter D/A-converting the output of said first sub-A/D converter;

as said first subtractor, a second subtractor selecting the first analog input signal or the output of said third D/A converter and subtracting the output of said fourth D/A converter from the selected signal, and a second amplifier amplifying an output of said second subtractor;

wherein a plurality of said second subtractors and a plurality of said second amplifiers are provided so as to correspond to respective ones of the comparators constituting said second sub-A/D converter.

10. The A/D converter according to claim 5, wherein said second sub-A/D converter, the plurality of said second subtractors and the plurality of said second amplifiers form a unit system and there are provided two or more of said unit system.

11. The A/D converter according to claim 6, wherein said second sub-A/D converter, the plurality of said second subtractors and the plurality of said second amplifiers are provided in each of two or more systems.

12. The A/D converter according to claim 7, wherein said second sub-A/D converter, the plurality of said second subtractors and the plurality of said second amplifiers form a unit and there are provided two or more of said units.

13. The A/D converter according to claim 8, wherein said second sub-A/D converter, the plurality of said second subtractors and the plurality of said second amplifiers form a unit and there are provided two or more of said units.

14. The A/D converter according to claim 9, wherein said second sub-A/D converter, the plurality of said second subtractors and the plurality of said second amplifiers form a unit and there are provided two or more of said units.

15. A multiple-stage serial-parallel A/D converter of two or more stages, wherein two initial stages which start the A/D conversion are formed of the serial-parallel A/D converter set forth in claim 1.

16. A multiple-stage serial-parallel A/D converter of two or more stages, wherein two initial stages which start the A/D conversion are formed of by the serial-parallel A/D converter set forth in claim 2.

17. A multiple-stage serial-parallel AID converter of two or more stages, wherein two initial stages which start the A/D conversion are formed of by the serial-parallel A/D converter set forth in claim 3.

18. A multiple-stage serial-parallel A/D converter of two or more stages, wherein two initial stages which start the A/D conversion are formed of the serial-parallel A/D converter set forth in claim 5.

19. A multiple-stage serial-parallel A/D converter of two or more stages, wherein two initial stages which start the A/D conversion are formed of the serial-parallel A/D converter set forth in claim 7.

20. A multiple-stage serial-parallel A/D converter of two or more stages, wherein two initial stages which start the A/D conversion are formed of the serial-parallel A/D converter set forth in claim 11.

21. A multiple-stage serial-parallel A/D converter of two or more stages, wherein two initial stages which start the A/D conversion are formed of the serial-parallel A/D converter set forth in claim 14.

22. The A/D converter system according to claim 10, wherein said unit systems are operated alternatively.

23. A serial-parallel A/D converter system having a sub-A/D converter unit of a first stage digitally converting analog input signal, and a sub-A/D converter unit of a second stage subtracting a D/A-converted output, which is obtained by D/A-converting the digital output of said sub-A/D converter unit of the first stage, from the analog input signal and converting a value obtained by the subtraction to a digital signal;

said sub-A/D converter unit of the first stage being constituted by a serial-parallel A/D converter module, which does not use a subtractor, comprising first and second sub-A/D converters and a D/A converter;

wherein a subtracting amplifier module is provided to correspond to each of comparators capable of time-shared input, constituting said sub-A/D converter unit of the second stage;

said subtracting amplifier module including:

a subtractor selecting the analog input signal or said D/A converted output and subtracting an output of a D/A converter, which is different from the first-mentioned D/A converter, from the selected signal; and an amplifier amplifying an output of said subtractor.

* * * * *

UNITED STATES PATENT AND TRADEMARK OFFICE
CERTIFICATE OF CORRECTION

PATENT NO. : 5,874,912
DATED       : February 23, 1999
INVENTOR(S) : Hiroshi Hasegawa It is certified that error appears in the above-identified patent and that said Letters Patent is hereby corrected as shown below:

Column 12, Line 10: "AD1b" should read --AD2b--

Column 12, Line 14: "AD1a" should read --AD2a--

Column 14, Line 29, Claim 5: "DIA" should read --D/A--

Column 14, Line 35, Claim 5: "AID" should read --A/D--

Column 16, Line 7, Claim 17: "AID" should read --A/D--

Signed and Sealed this

Eighteenth Day of July, 2000

*Attest:*

Q. TODD DICKINSON

*Attesting Officer*       *Director of Patents and Trademarks*